(12) United States Patent
Hemmer et al.

(10) Patent No.: US 10,496,336 B2
(45) Date of Patent: Dec. 3, 2019

(54) K-D TREE ENCODING FOR POINT CLOUDS USING DEVIATIONS

(71) Applicant: Google Inc., Mountain View, CA (US)

(72) Inventors: Michael Hemmer, San Francisco, CA (US); Ondrej Stava, San Jose, CA (US)

(73) Assignee: GOOGLE LLC, Mountian View, CA (US)

( * ) Notice: Subject to any disclaimer, the term of this patent is extended or adjusted under 35 U.S.C. 154(b) by 444 days.

(21) Appl. No.: 15/354,669

(22) Filed: Nov. 17, 2016

(65) Prior Publication Data

US 2018/0137224 A1  May 17, 2018

(51) Int. Cl.
*G06T 9/40* (2006.01)
*G06F 3/06* (2006.01)

(52) U.S. Cl.
CPC .................................. *G06F 3/0673* (2013.01)

(58) Field of Classification Search
CPC .... G06F 3/0673; G06F 3/0604; G06F 3/0656; G06T 9/00–40; H03M 7/30; H03M 7/40; H03M 7/405; H03M 7/24; H04N 19/00–99
See application file for complete search history.

(56) References Cited

U.S. PATENT DOCUMENTS

| | | |
|---|---|---|
| 6,088,035 A | 7/2000 | Sudarsky et al. |
| 6,167,159 A | 12/2000 | Touma et al. |
| 6,532,012 B2 | 3/2003 | Deering |
| 6,563,500 B1 | 5/2003 | Seo et al. |
| 6,831,637 B1 * | 12/2004 | Mack ...................... G06T 9/001 345/419 |
| 6,879,324 B1 | 4/2005 | Hoppe et al. |
| 7,103,211 B1 | 9/2006 | Medioni et al. |
| 7,280,109 B2 | 10/2007 | Hoppe et al. |
| 7,283,134 B2 | 10/2007 | Hoppe et al. |
| 7,804,498 B1 | 9/2010 | Graham et al. |
| 8,022,951 B2 | 9/2011 | Zhirkov et al. |
| 8,217,941 B2 | 7/2012 | Park et al. |

(Continued)

FOREIGN PATENT DOCUMENTS

| | | |
|---|---|---|
| CN | 102467753 B | 10/2013 |
| CN | 102682103 B | 3/2014 |

(Continued)

OTHER PUBLICATIONS

Extended European Search Report for European Application No. 17202184.2, dated Feb. 20, 2018, 8 pages.

(Continued)

*Primary Examiner* — Sean T Motsinger
(74) *Attorney, Agent, or Firm* — Brake Hughes Bellermann LLP

(57) ABSTRACT

An encoder includes a processor, a buffer, and a memory. The memory includes code as instructions that cause the processor to perform a number of steps. The steps include quantizing geometric data associated with a geometric construct, partitioning the geometric construct, determining a number of points in the partition, generating a deviation value based on the number of points in the partition, storing the deviation value in the buffer, and entropy encoding the deviation value.

18 Claims, 14 Drawing Sheets

(56) References Cited

U.S. PATENT DOCUMENTS

| | | | |
|---|---|---|---|
| 8,390,622 | B2 | 3/2013 | Park et al. |
| 8,660,376 | B2 | 2/2014 | Ahn et al. |
| 8,736,603 | B2 | 5/2014 | Curington et al. |
| 8,805,097 | B2 | 8/2014 | Lee et al. |
| 8,811,758 | B2 | 8/2014 | Leed et al. |
| 8,884,953 | B2 | 11/2014 | Teng et al. |
| 8,949,092 | B2 | 2/2015 | Chen et al. |
| 9,064,311 | B2 | 6/2015 | Mammou et al. |
| 9,111,333 | B2 | 8/2015 | Jiang |
| 9,171,383 | B2 | 10/2015 | Lee et al. |
| 9,286,538 | B1 | 3/2016 | Chen et al. |
| 9,348,860 | B2 | 5/2016 | Cai et al. |
| 9,396,512 | B2 | 7/2016 | Karras |
| 9,424,663 | B2 | 8/2016 | Ahn et al. |
| 2004/0208382 | A1 | 10/2004 | Gioia et al. |
| 2005/0168460 | A1* | 8/2005 | Razdan ................. G06F 16/904 345/419 |
| 2011/0010400 | A1 | 1/2011 | Hayes et al. |
| 2013/0268862 | A1 | 10/2013 | Glaser et al. |
| 2013/0297574 | A1 | 11/2013 | Thiyanaratnam |
| 2013/0335406 | A1 | 12/2013 | Tabellion |
| 2014/0168360 | A1 | 6/2014 | Ahn et al. |
| 2014/0303944 | A1 | 10/2014 | Jiang et al. |
| 2014/0376827 | A1* | 12/2014 | Jiang ..................... G06T 9/40 382/238 |
| 2015/0081252 | A1* | 3/2015 | Loss .................. G06F 17/5004 703/1 |
| 2015/0172717 | A1* | 6/2015 | Zhao ................... H04N 19/597 375/240.16 |
| 2016/0086353 | A1 | 3/2016 | Zalik et al. |
| 2016/0127746 | A1* | 5/2016 | Maurer ................. H04N 19/65 382/232 |
| 2016/0275719 | A1 | 9/2016 | Oke |
| 2017/0214943 | A1* | 7/2017 | Cohen ................. H04N 19/136 |
| 2017/0243404 | A1* | 8/2017 | Morales .................. G06T 5/30 |
| 2017/0249401 | A1* | 8/2017 | Eckart ................ G06F 17/5009 |
| 2017/0347100 | A1* | 11/2017 | Chou ..................... G06T 9/001 |
| 2017/0347122 | A1* | 11/2017 | Chou ..................... H04N 19/60 |
| 2018/0053324 | A1* | 2/2018 | Cohen ................... G06T 9/001 |
| 2018/0137224 | A1 | 5/2018 | Hemmer et al. |
| 2019/0081638 | A1* | 3/2019 | Mammou .......... H03M 7/3059 |

FOREIGN PATENT DOCUMENTS

| | | |
|---|---|---|
| KR | 1019990085657 A | 12/1999 |
| KR | 1020010008944 A | 2/2001 |
| KR | 1020030071019 A | 9/2003 |
| KR | 100420006 B1 | 2/2004 |
| KR | 1020040096209 A | 11/2004 |
| KR | 1020050006322 A | 1/2005 |
| KR | 1020050006323 A | 1/2005 |
| KR | 1020060087631 A | 8/2006 |
| KR | 1020060087647 A | 8/2006 |
| KR | 1020060087662 A | 8/2006 |
| KR | 1020060088136 A | 8/2006 |
| KR | 1020080066216 A | 7/2008 |
| KR | 1020090025672 A | 3/2009 |
| KR | 1020090097057 A | 9/2009 |
| KR | 100927601 B1 | 11/2009 |
| KR | 1020100007685 A | 1/2010 |
| KR | 20100012724 A | 2/2010 |
| KR | 20100112848 A | 10/2010 |
| WO | 00/45237 A2 | 8/2000 |

OTHER PUBLICATIONS

International Search Report and Written Opinion for Application No. PCT/US2017/061781, dated Feb. 20, 2018, 15 pages.

Kanimozhi et al.: "Real-Time Compression Strategy on Various Point Cloud Streams", International Journal of Futuristic Science Engineering and Technology, vol. 1, No. 3, Mar. 1, 2013, pp. 245-249, XP002732921.

Smith et al.: "Progressive encoding and compression of surfaces generated from point cloud data", Computers and Graphics, vol. 36, No. 5, Mar. 17, 2012, pp. 341-348, XP028483284.

Alliez, et al., "Progressive compression for lossless transmission of triangle meshes", Proceedings of the 28th annual conference on Computer graphics and interactive techniques, 2001, 8 pages.

Schnabel, "Octree-based Point-Cloud Compression", Eurographics Symposium on Point-Based Graphics, 2006, 11 pages.

"Entropy encoding", Wikipedia, the free encyclopedia, retrieved from https://en.wikipedia.org/wiki/Entropy_encoding, Apr. 11, 2016, 1 page.

"Quantization", Wikipedia, the free encyclopedia, retrieved from https://en.wikipedia.org/wiki/Quantization, Apr. 11, 2016, 1 page.

Gandoin, et al., "Progressive lossless compression of arbitrary simplicial complexes", ACM Transactions on Graphics (TOG), Jul. 23, 2002, pp. 372-379.

Gumhold, et al., "Predictive point-cloud compression", ACM SIGGRAPH 2005 Sketches, Jul. 31, 2005, 1 page.

Huang, et al., "Octree-Based Progressive Geometry Coding of Point Clouds", SPBG, Jul. 29, 2006; pp. 103-110.

Merry, et al., "Compression of dense and regular point clouds", Computer Graphics Forum, Dec. 1, 2006, pp. 709-716.

Waschbusch, et al., "Progressive compression of point-sampled models", Eurographics symposium on point-based graphics, Jun. 2 ,2004, pp. 95-102.

* cited by examiner

| ... | NP-220 | NP-218 | NP-212 | NP-210 | NP-204 | NP-202 |

FIG. 6A

| ... | V-238 | V-236 | V-228 | V-230 | V-224 | V-226 |

FIG. 6B

| ... | A6 | A5 | A4 | A3 | A2 | A1 |

FIG. 6C

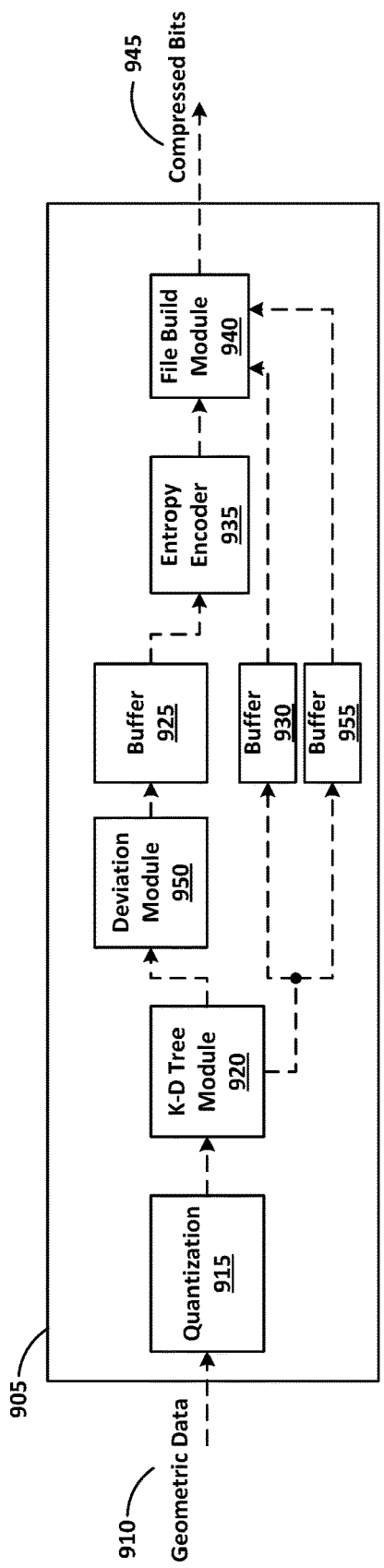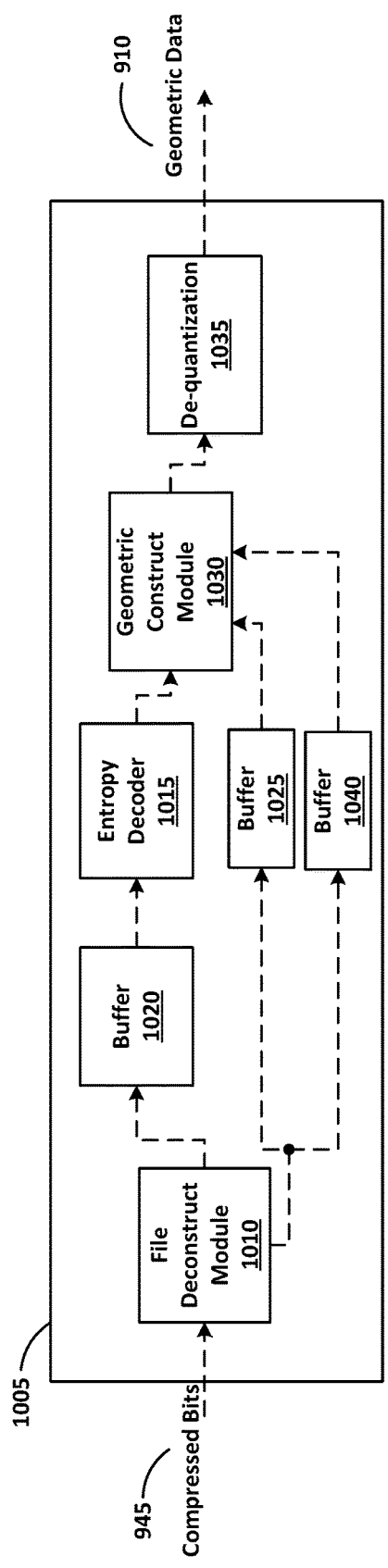
FIG. 9
FIG. 10

K-D TREE ENCODING FOR POINT CLOUDS USING DEVIATIONS

FIELD

Embodiments relate to encoding point clouds or points within a geometric construct using a k-D tree.

BACKGROUND

Generating a representation (e.g., compressing or encoding) as well as interpreting the representation (e.g., decompressing or decoding) of a large set of data points should include using as little space (e.g., bandwidth or memory) to store and/or communicate the representation as possible, the generating should be fast (considering processing power and situational timelines) and code complexity should be minimized (e.g., to affect the processing time).

SUMMARY

Example embodiments describe systems and methods to encode point clouds and to decode encoded point clouds.

In a general aspect, an encoder includes a processor, a buffer, and a memory. The memory includes code as instructions that cause the processor to perform a number of steps. The steps include quantizing geometric data associated with a geometric construct, partitioning the geometric construct, determining a number of points in the partition, generating a deviation value based on the number of points in the partition, storing the deviation value in the buffer, and entropy encoding the deviation value.

In another general aspect, a method includes quantizing geometric data associated with a geometric construct, partitioning the geometric construct, determining a number of points in the partition, generate a deviation value based on the number of points in the partition, storing the deviation value in a buffer, and entropy encoding the deviation value.

Implementations can include one or more of the following features. For example, the quantizing of the geometric data can include converting a float or double precision value associated with the geometric data into a b-bit integer representation. The geometric data can represent a point cloud and the geometric construct can be a two or more dimensional shape encompassing the point cloud. The partitioning of the geometric construct can include recursively partitioning the geometric construct using a k-D tree. For example, the partitioning of the geometric construct can include partitioning the geometric construct using a k-D tree, and determining whether a partition can include more than a threshold number of points. Upon determining the partition includes more than the threshold number of points, store the number of points in the buffer, and further partition the partition including more than the threshold number of points. Upon determining the partition includes less than the threshold number of points, determine whether the partition includes at least one point, upon determining the partition includes at least one point the buffer can be a first buffer, the encoder can further include a second buffer, and store a value representing a position of a point in the second buffer.

For example, the deviation value corresponding to the number of points can be determined based on a number of points in a parent partition. The partitioning of the geometric construct can include partitioning the geometric construct using a k-D tree into a first partition, the first partition can include a second partition and a third partition, and the deviation value corresponding to the number of points in the second partition can be determined based on a number of points in the first partition.

In still another general aspect, a decoder includes a processor, a first buffer, a second buffer, and a memory. The memory includes code as instructions that cause the processor to load the first buffer using data from an encoded geometric data file, load the second buffer using data from the encoded geometric data file, entropy decode the first buffer, determine a first partition in a geometric construct to insert data from the first buffer, insert a first number of points based on the data from the first buffer into the partition, and determine whether the first number of points is greater than a threshold value. Upon determining the first number of points is greater than the threshold value, divide the first partition into a second partition and third partition, and move a subset of the first number of points to one of the second partition or the third partition based on the data from the first buffer. Upon determining the first number of points is less than or equal to the threshold value, position a point in the first partition based on data in the second buffer, and repeat the determining whether the first number of points is greater than the threshold value on the second partition or the third partition replacing the first number of points with the subset of the first number of points and until each partition in the geometric construct includes a number of points less than or equal to the threshold value.

Implementations can include one or more of the following features. For example, the entropy decoding of the first buffer can include converting a deviation value corresponding to a number of points in the second partition. The geometric data file can include geometric data representing a point cloud and the geometric construct can be a two or more dimensional shape encompassing the point cloud. The determining the first partition and determining the second partition can include building a k-D tree based on the first buffer and the second buffer. The entropy decoding of the first buffer can include converting a deviation value corresponding to a number of points in the second partition, and the deviation value corresponding to the number of points can be determined based on a number of points in a larger partition including the partition. The second buffer can include data representing a position of a point in the geometric construct.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of the example embodiments and wherein:

FIGS. 2A-2K illustrate a recursive k-D tree representation of a two dimensional (2D) geometric construct according to at least one example embodiment.

FIGS. 3A-3M illustrate another recursive k-D tree representation of a two dimensional (2D) geometric construct according to at least one example embodiment.

FIGS. 6A-6C illustrate buffers according to at least one example embodiment.

FIG. 9 illustrates an encoder according to at least one example embodiment.

FIG. 10 illustrates a decoder according to at least one example embodiment.

Figure 1:
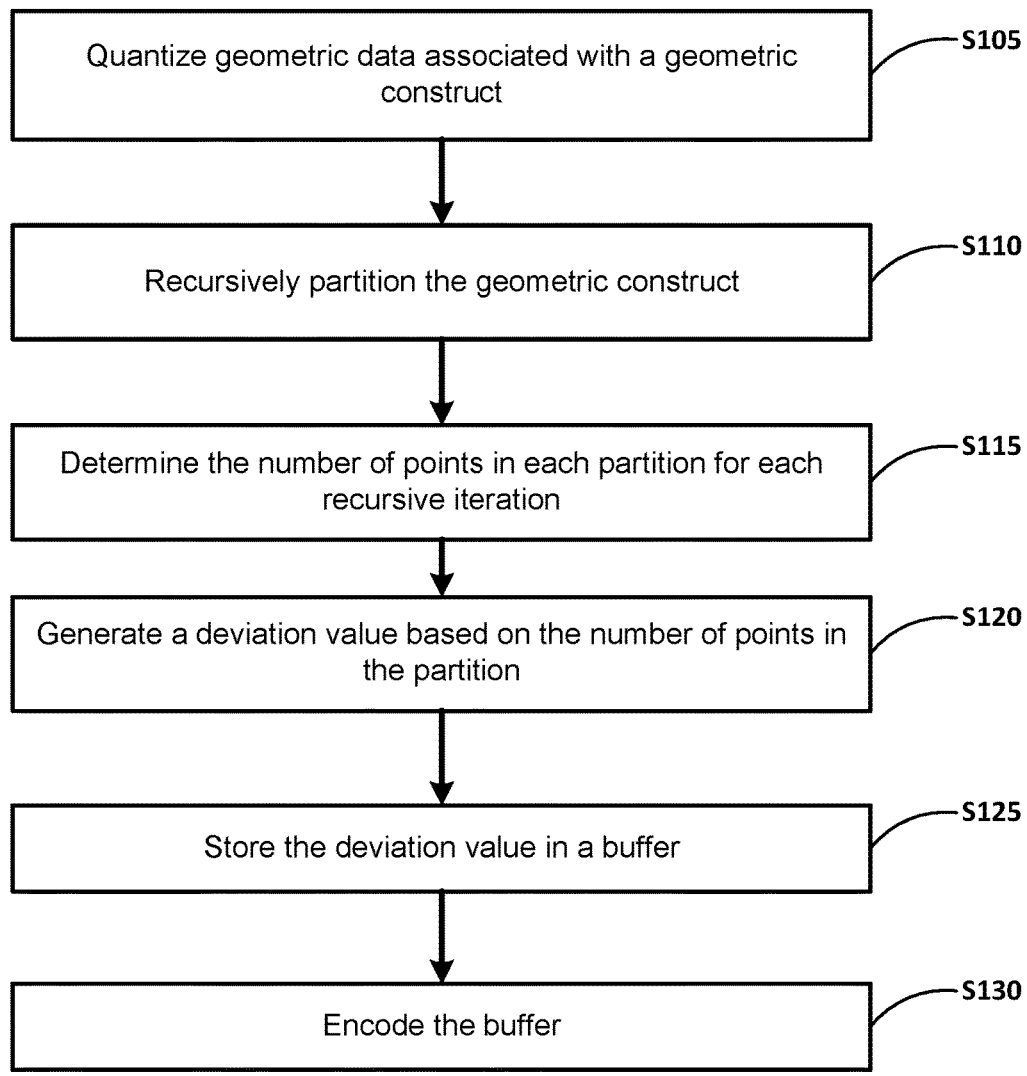
FIG. 1 illustrates a method for encoding data according to at least one example embodiment.

It should be noted that these figures are intended to illustrate the general characteristics of methods and/or structure utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the positioning of portions, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

While example embodiments may include various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims.

Figure 7:
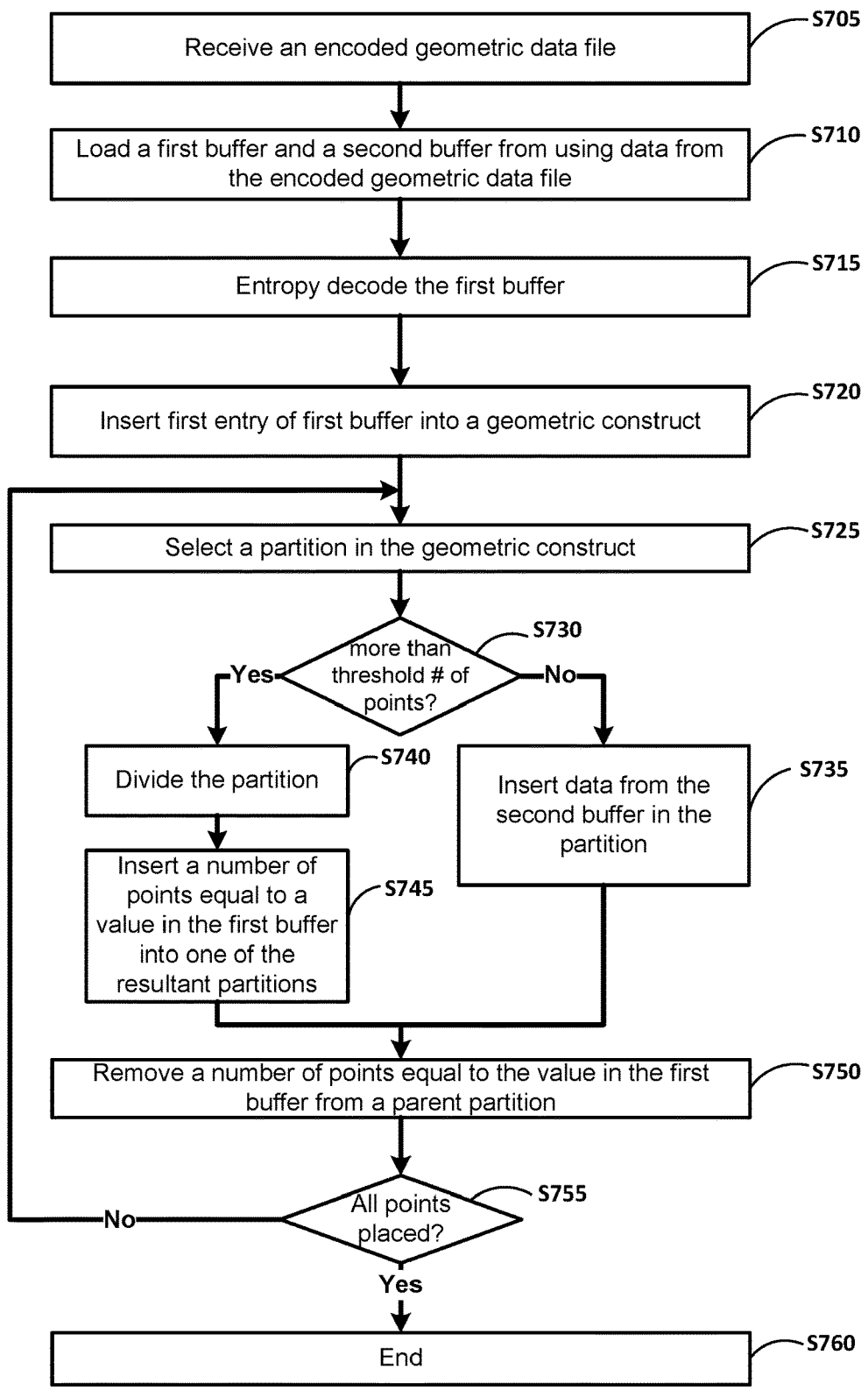
FIG. 7 illustrates a method for decoding data according to at least one example embodiment.

The method steps described with regard to FIGS. 1 and 7 may be executed as software code stored in a memory (e.g., at least one memory 1110, 1210) associated with an encoder and/or decoder system (e.g., as shown in FIGS. 9-13) and executed by at least one processor (e.g., processor 1105, 1205) associated with the encoder and/or system. However, alternative embodiments are contemplated such as an encoder or a decoder embodied as a special purpose processor.

For example, the method steps may be performed by an application-specific integrated circuit, or ASIC. For example, the ASIC may be configured as the encoder 905, the decoder 1005, the controller 1120 and/or the controller 1220. Although the steps described below are described as being executed by a processor, the steps are not necessarily executed by a same processor. In other words, at least one processor may execute the steps described below with regard to FIGS. 1 and 7.

FIG. 1 illustrates a method for encoding data according to at least one example embodiment. As shown in FIG. 1, in step S105 geometric data associated with a geometric construct is quantized. For example, point coordinates representing the geometric construct (also referred to as a point cloud) can be stored (e.g., in memory) as float or double precision bit representation. However, float or double precision can be more precise than is needed (e.g., to reconstruct the data with an acceptable amount of loss). As an example, the point cloud may generated from a scanner (e.g., scanning an exterior of a building) with some measurement error. Accordingly, a significant portion of the lower bits can be noise. Quantization may remove the lower bits. However, (in this example) the lower bits are associated with measurement error which may have a negligible effect when a resultant compressed (e.g., encoded) point cloud is decompressed (decoded).

Quantization can include mapping or converting a range of values (e.g., float or double) to a single quantum value. In an example embodiment, quantization can convert the floats associated with the point cloud into a b-bit long integer representation. Accordingly, the point cloud can be represented by positive integers with at most b bits, where b is the number of desired quantization bits (precision=$(½)^b$).

In step S110 partition the geometric construct recursively. For example, the geometric construct (e.g., the 2D construct described below with regard to FIGS. 2A-2K, FIGS. 3A-3M and/or FIGS. 4A-4F) can be partitioned by halving the construct within an axis. Then one of the portions can be halved within another axis and so forth until a portion of the geometric construct includes a number of points equal to or below a threshold value (e.g., 2 points). In an example implementation, the geometric construct can be recursively partitioned using a k-D tree algorithm (described below in more detail).

In step S115 the number of points in each partition for each recursive iteration is determined. For example, referring to FIG. 2B, the number of points in block 204 and block 206 can be determined. In another (e.g., subsequent) recursive iteration, referring to FIG. 2E, the number of points in block 216 and block 218 can be determined. In an example implementation, the number of points in block 216 and block 218 can be determined. However, in a previous iteration, the number of points in block 212 could have been determined and stored. Therefore, if the number of points in block 218 is stored, the number of points in block 216 is known because the number of points in block 216 is the number of points in block 212 minus the number of points in block 218.

In step S120 a deviation value based on the number of points in the partition is generated. For example, a reference value can be determined as a number of points in a partition (e.g., parent partition or block) of a geometric construct (N) divided by two (N/2). In an example implementation, the reference value can be the number of points divided by two (N/2) of a parent block or node at which the block was divided into two portions (e.g., two blocks) or halved. For example, referring to FIGS. 2C and 2D, block 210 was divided or halved (e.g., split down the middle) to generate block 212 and 214. The reference value for block 212 and block 214 can be the number of points in block 210 divided by two (2) (although for efficiencies the reference value may not be used for block 214). The compression rate should be higher by compressing the deviation value as compared to the number of points because the deviation value should be a smaller integer number (e.g., have a larger number of leading zeros).

The deviation value can then be determined based on the reference value (N/2) and the data. For example, the deviation value for value p (where p is the number of points in a block or associated with a node in the k-D tree) can be p−N/2 where N/2 is the reference value (e.g., the number of points in the parent block divided by two). Continuing the above example, the deviation value for block 212 can be NP-212−(NP-210/2). Deviation values should be smaller (e.g., have more leading zero's in b-bit integer) than the actual value p. In an example implementation (e.g., as shown in FIGS. 4A-4F) determining deviation values can be optional. Therefore, step S120 may be skipped, the number of points in the partition may be passed through step S120 and/or the algorithm used to determine or calculate the deviation value may return the number of points in the partition in some implementations.

In step S125 the deviation value is stored in a buffer. For example, the deviation value can be stored in buffer 925 (described in more detail below). In an example implementation, the deviation value corresponding to the number of points in one of the partitioned blocks is stored. Memory, bits, bandwidth and the like can be reduced by storing the number of points in one of the partitioned blocks per recursive iteration instead of storing the number of points in both blocks. In addition, the number of bits used to store each deviation value corresponding to the number of points in one of the partition blocks may be reduced to (a rounded up number of bits equal to) $\log_2(N)$ where N is the number of points in the corresponding partition block. For example (referring to FIG. 2K described below), if block 208 contains 500 points, the number of points in block 210 can also be at most 500. Therefore, the number of bits needed to store the number is $\log_2(500)$ rounded up. As discussed above, in an example implementation determining deviation values can be optional. Accordingly, step S125 may store the number of points in the partition in the buffer.

In step S130 the buffer is encoded. For example, each integer representation in the buffer (e.g., buffer 925) can be encoded. In an example implementation, the buffer can be entropy or arithmetic encoded. The deviation values can be encoded using a codec such as Huffman coding, arithmetic coding, folding integer coding and the like. Instead of using the same amount of bits for every symbol, Huffman coding or arithmetic coding or folding integer coding and the like assign fewer bits to the most frequent symbols while using more bits on the less frequent symbols. Overall, this fewer bits for the entire sequence. Huffman encoding can be fast while arithmetic encoding can achieve better compression rates. Therefore, selection between an entropy encoding scheme can be based on speed versus compression rate objectives. Using the deviation values can result in smaller values which, in-turn can be more frequent and thus result in a higher compression rate when entropy encoded.

FIGS. 2A-2K illustrate a recursive k-D tree representation of a two dimensional (2D) geometric construct according to at least one example embodiment. The Example embodiment described with regard to FIGS. 2A-2K implements a depth first recursion. In other words, the dividing or partitioning the blocks includes selecting a next block for partitioning by going deeper (e.g., a level down) instead of selecting a next block on the same level. Further, the example implementation first divides or partitions along the x-axis and then the y-axis. Example embodiments are not limited to depth first recursion or a particular axis order.

Figure 2A:
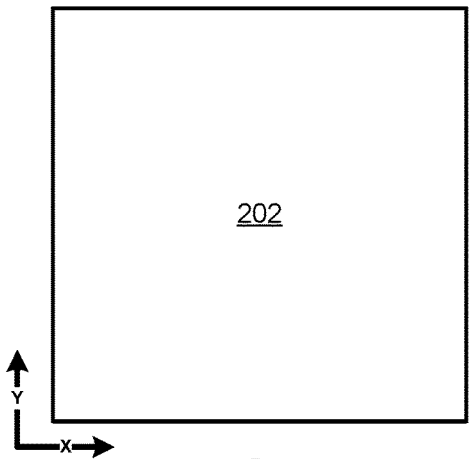

FIG. 2A illustrates the two dimensional (2D) geometric construct as a block 202 having an x-axis and a y-axis. The block 202 can contain a point cloud, not shown, having a number of points. Although block 202 is illustrated as being two dimensional, example embodiments are not limited thereto. Instead, block 202 and the corresponding point cloud could be three dimensional, four dimensional, five dimensional, six dimensional and so forth. In other words, the corresponding point cloud could be and the corresponding geometric construct can be a two or more dimensional shape. For example, block 202 and the corresponding point cloud could be generated using a three dimensional laser scan. Therefore, block 202 and the corresponding point cloud could include an x-axis, a y-axis and a z-axis (representing depth). Further, the laser scan could be a color laser scan. Accordingly, there may also be a RGB representation each having a corresponding axis in block 202 and the corresponding point cloud could be totaling six axis or six dimensions. Therefore, although the following description is of a two dimensional geometric construct for the sake of brevity, it will be understood that additional dimensions are within the scope of this disclosure.

As described above, the block 202 can contain a point cloud, not shown, having a number of points. Further, the points can be quantized such that the points are represented by positive integers with at most b bits, where b is the number of desired quantization bits. Therefore, the x-axis can have $2^b$ unique values and the y-axis can have $2^b$ unique values. The point cloud can include any number of points. The number of points can be a relatively large number (e.g., in the millions, tens of millions and the like).

Figure 2B:
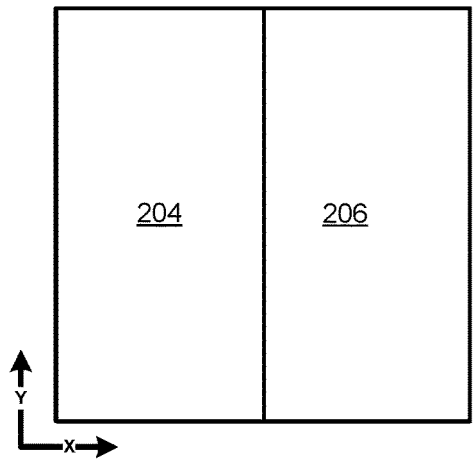

Referring now to FIG. 2B, the 2D geometric construct is divided into partition or block (hereinafter block) 204 and block 206. In other words, block 202 is divided or partitioned by halving the 2D geometric construct within the x-axis. Block 204 and block 206 can each have a number of points within the boundaries of the block. The number of points in each block can vary based on the position of the points along the x-axis. For example, block 204 and block 206 could have approximately the same number of points. Block 204 could have all of the points and block 206 could have zero (and vise-versa). Any combination of points between the two blocks is possible. In an example implementation, the lower and left boundaries of the block belong to the block and the upper and right boundaries do not. Therefore, points along the lower and left boundaries of the block belong to the block and points along the upper and right boundaries do not. Therefore, the first L bits of a coordinate of a point in the box are identical to the first L bits of the corresponding coordinate of the lower left corner of that box, where L is the number of times the algorithm has already subdivided the corresponding axis.

Figure 2C:
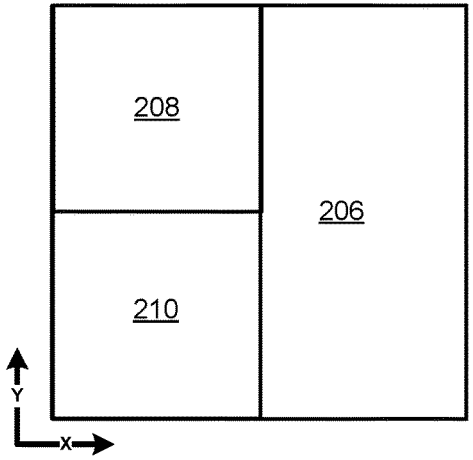

Referring now to FIG. 2C, the 2D geometric construct is divided into block 208, block 210 and block 206. In other words, block 204 is divided or partitioned by halving the 2D geometric construct within the y-axis. Block 208 and block 210 can each have a number of points within the boundaries of the block. The division of block 204 illustrated in FIG. 2C assumes block 204 includes some number of points above a threshold number of points (e.g., 2 points, 3 points and the like). However, should block 204 be empty or have less than the threshold number of points, the block 204 will not be further divided. In example implementations, the recursive division, using the k-D tree algorithm, divides the 2D construct to the left (e.g., to the lower values of the x-axis or y-axis) first. The recursion continues to the left until a block includes (or includes less than) the threshold number of points. Then the recursive division moves to the next leftmost block having a number of points greater than threshold value.

Figure 2D:
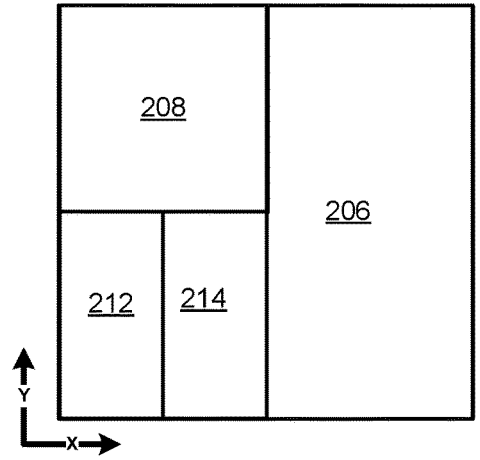
Figure 2E:
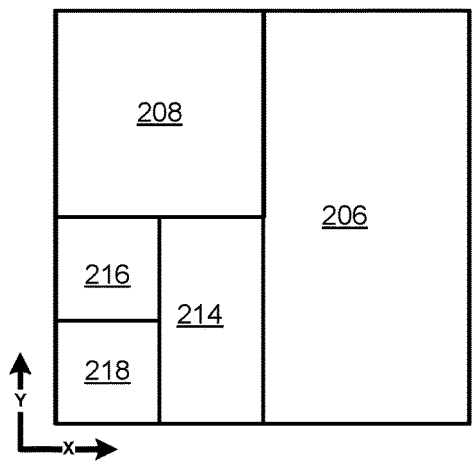
Figure 2F:
Figure 2G:
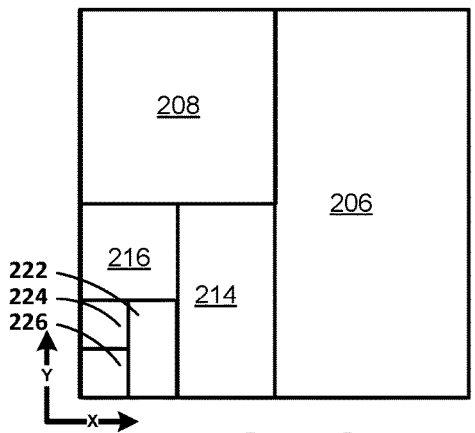

Referring now to FIG. 2D, the 2D geometric construct is divided into block 212, block 214, block 208 and block 206. In other words, block 210 is divided or partitioned by halving block 210 within the x-axis. Block 212 and block 214 can each have a number of points within the boundaries of the block. Referring now to FIG. 2E, the 2D geometric construct is divided into block 216, block 218, block 214, block 208 and block 206. In other words, block 212 is divided or partitioned by halving block 212 within the y-axis. Block 216 and block 218 can each have a number of points within the boundaries of the block. Referring now to FIG. 2F, the 2D geometric construct is divided into block 220, block 222, block 216, block 214, block 208 and block 206. In other words, block 218 is divided or partitioned by halving block 218 within the x-axis. Block 220 and block 222 can each have a number of points within the boundaries of the block. Referring now to FIG. 2G, the 2D geometric construct is divided into block 224 block 226, block 222, block 216, block 214, block 208 and block 206. In other words, block 220 is divided or partitioned by halving block 220 within the y-axis. Block 224 and block 226 can each have a number of points within the boundaries of the block.

Figure 2H:
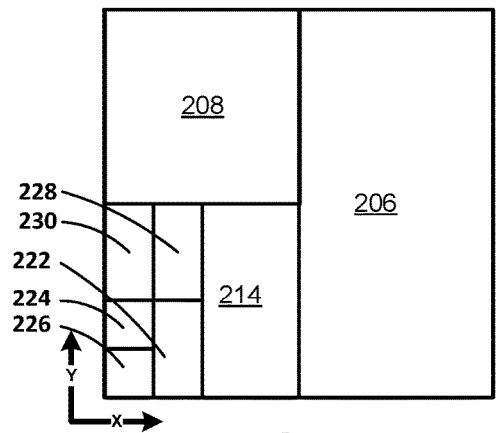

Referring now to FIG. 2H, block 222 is determined to have a number of points less than or equal to the threshold number of points (e.g., 2 points, 3 points and the like). For example, if the threshold number of points is two (2), block 222 has two (2) or less points within the boundary of the block. Therefore, block 222 is not divided further. Accordingly, the recursive algorithm moves on to block 216, where block 216 is evaluated and determined to have a number of points greater than the threshold number of points (e.g., 2 points, 3 points and the like). As a result, the 2D geometric construct is divided into block 228, block 230, block 224 and block 226, block 214, block 208 and block 206. In other words, block 216 is divided or partitioned by halving block 216 within the x-axis. Block 228 and block 230 can each have a number of points within the boundaries of the block.

Figure 2J:
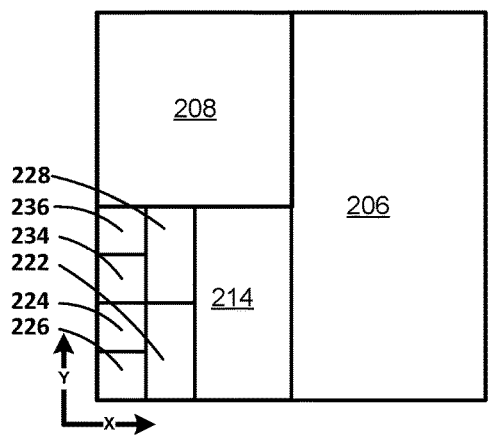

Referring now to FIG. 2J, the 2D geometric construct is divided into block 236, block 234, block 228, block 226, block 224, block 222, block 214, block 208 and block 206. In other words, block 230 is divided or partitioned by halving block 230 within the y-axis. Block 234 and block 236 can each have a number of points within the boundaries of the block. In this recursive iteration, block 230 was determined to have a number of points greater the threshold number of points (e.g., 2 points, 3 points and the like). For example, if the threshold number of points is two (2), block 230 has greater than two (2) points within the boundary of the block. Therefore, block 230 is divided or partitioned the y-axis because block 230 was generated when block 216 was divided or partitioned within the x-axis.

Figure 2K:
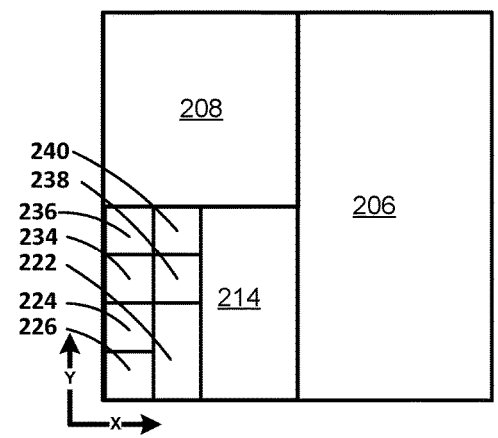

Referring now to FIG. 2K, the 2D geometric construct is divided into block 240, block 238, block 236, block 234, block 226, block 224, block 222, block 214, block 208 and block 206. In other words, block 228 is divided or partitioned by halving block 228 within the y-axis. In this recursive iteration, block 234 and block 236 were determined to have a number of points less than or equal to the threshold number of points (e.g., 2 points, 3 points and the like). For example, if the threshold number of points is two (2), block 234 and block 236 have less than or equal to two (2) points within the boundary of the block. Block 238 and block 240 can each have a number of points within the boundaries of the block. Although blocks 206, 208 and 214 are not illustrated as being further divided, unless blocks 206, 208 and 214 are empty or include less than or equal to the threshold number of points, blocks 206, 208 and 214 would be further divided as the recursive algorithm continues. In other words, further description of the recursive algorithm as applied to blocks 206, 208 and 214 would repeat the above implementation and is not further described for the sake of brevity.

FIGS. 3A-3M illustrate another recursive k-D tree representation of a two dimensional (2D) geometric construct according to at least one example embodiment. The Example embodiment described with regard to FIGS. 3A-3M implements a breadth first recursion. In other words, the dividing or partitioning the blocks includes selecting a next block for partitioning by moving to a next block on the same level (e.g., a horizontal) instead of selecting a next block on the deeper level. Further, the example implementation first divides or partitions along the x-axis and then the y-axis. Example embodiments are not limited to breadth first recursion or a particular axis order.

Figure 3A:
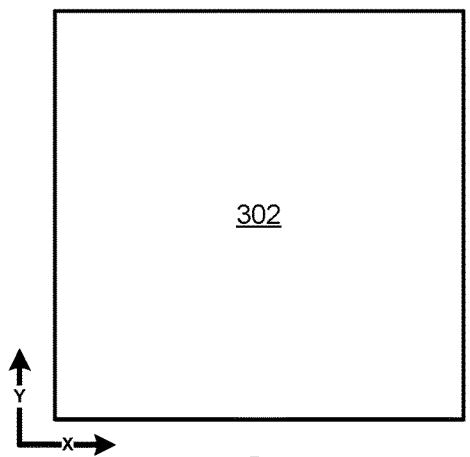

FIG. 3A illustrates the two dimensional (2D) geometric construct as a block 302 having an x-axis and a y-axis. The block 302 can contain a point cloud, not shown, having a number of points. Although block 302 is illustrated as being two dimensional, example embodiments are not limited thereto. Instead, block 302 and the corresponding point cloud could be three dimensional, four dimensional, five dimensional, six dimensional and so forth. In other words, the corresponding point cloud could be and the corresponding geometric construct can be a two or more dimensional shape. For example, block 302 and the corresponding point cloud could be generated using a three dimensional laser scan. Therefore, block 302 and the corresponding point cloud could include an x-axis, a y-axis and a z-axis (representing depth). Further, the laser scan could be a color laser scan. Accordingly, there may also be a RGB representation each having a corresponding axis in block 302 and the corresponding point cloud could be totaling six axis or six dimensions. Therefore, although the following description is of a two dimensional geometric construct for the sake of brevity, it will be understood that additional dimensions are within the scope of this disclosure.

The block 302 can contain a point cloud, not shown, having a number of points. Further, the points can be quantized such that the points are represented by positive integers with at most b bits, where b is the number of desired quantization bits. Therefore, the x-axis can have $2^b$ unique values and the y-axis can have $2^b$ unique values. The point cloud can include any number of points. The number of points can be a relatively large number (e.g., in the millions, tens of millions and the like).

Figure 3B:
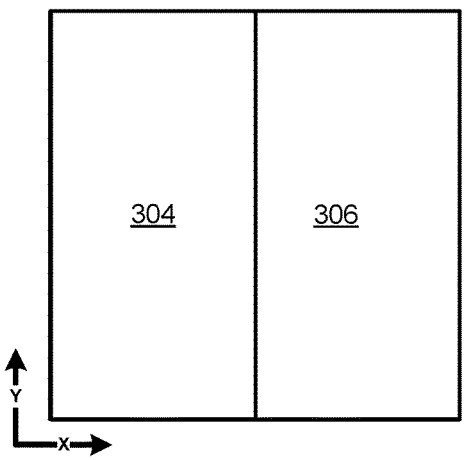

Referring now to FIG. 3B, the 2D geometric construct is divided into partition or block (hereinafter block) 304 and block 306. In other words, block 302 is divided or partitioned by halving the 2D geometric construct within the x-axis. Block 304 and block 306 can each have a number of points within the boundaries of the block. The number of points in each block can vary based on the position of the points along the x-axis. For example, block 304 and block 306 could have approximately the same number of points. Block 304 could have all of the points and block 306 could have zero (and vise-versa). Any combination of points between the two blocks is possible.

Figure 3C:
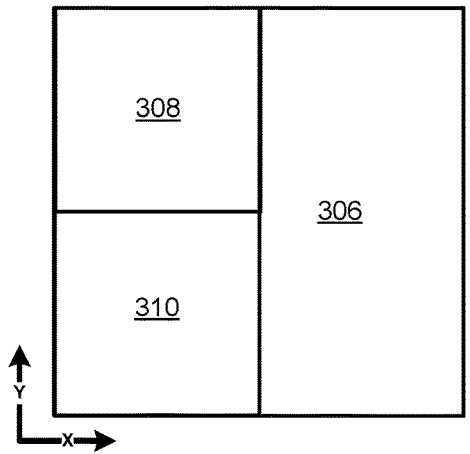

Referring now to FIG. 3C, the 2D geometric construct is divided into block 308, block 310 and block 306. In other words, block 304 is divided or partitioned by halving the 2D geometric construct within the y-axis. Block 308 and block 310 can each have a number of points within the boundaries of the block. The division of block 304 illustrated in FIG. 3C assumes block 304 includes some number of points above a threshold number of points (e.g., 2 points, 3 points and the like). However, should block 204 be empty or have less than the threshold number of points, the block 204 will not be further divided. In example implementations, the recursive division, using the k-D tree algorithm, divides the 2D construct to the left (e.g., to the lower values of the x-axis or y-axis) first. The recursion continues to the right and back to the left and so on until a block includes (or includes less than) the threshold number of points.

Figure 3D:
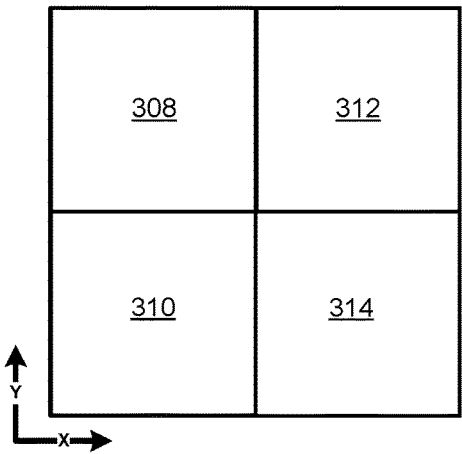

Referring now to FIG. 3D, the 2D geometric construct is divided into block 308, block 310, block 312 and block 314. In other words, block 306 is divided or partitioned by halving the 2D geometric construct within the y-axis. Block 312 and block 314 can each have a number of points within the boundaries of the block. The division of block 306 illustrated in FIG. 3D assumes block 306 includes some number of points above a threshold number of points (e.g., 2 points, 3 points and the like).

Figure 3E:
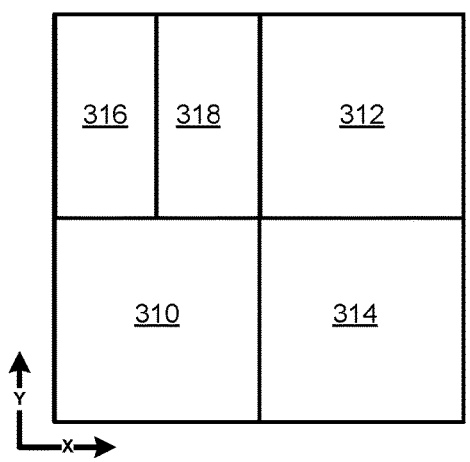

Referring now to FIG. 3E, the 2D geometric construct is divided into block 310, block 312, block 314, block 316 and block 318. In other words, block 308 is divided or partitioned by halving the 2D geometric construct within the x-axis. Block 316 and block 318 can each have a number of points within the boundaries of the block. The division of block 308 illustrated in FIG. 3E assumes block 308 includes some number of points above a threshold number of points (e.g., 2 points, 3 points and the like).

Figure 3F:
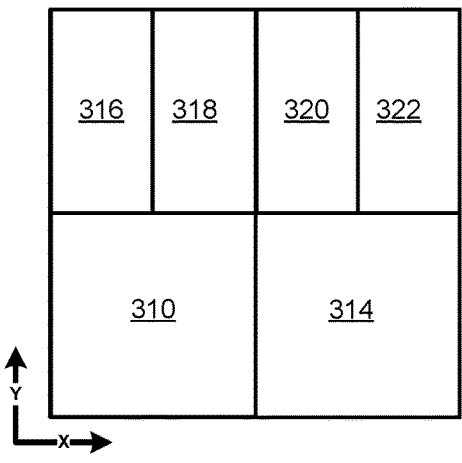

Referring now to FIG. 3F, the 2D geometric construct is divided into block 310, block 314, block 316, block 318, block 320 and block 322. In other words, block 312 is divided or partitioned by halving the 2D geometric construct within the x-axis. Block 320 and block 322 can each have a number of points within the boundaries of the block. The division of block 312 illustrated in FIG. 3F assumes block 312 includes some number of points above a threshold number of points (e.g., 2 points, 3 points and the like).

Figure 3G:
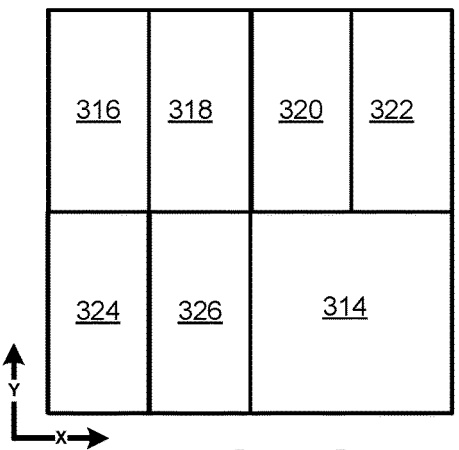

Referring now to FIG. 3G, the 2D geometric construct is divided into block 314, block 316, block 318, block 320, block 322, block 324 and block 326. In other words, block 310 is divided or partitioned by halving the 2D geometric construct within the x-axis. Block 322 and block 324 can each have a number of points within the boundaries of the block. The division of block 310 illustrated in FIG. 3G assumes block 310 includes some number of points above a threshold number of points (e.g., 2 points, 3 points and the like).

Figure 3H:
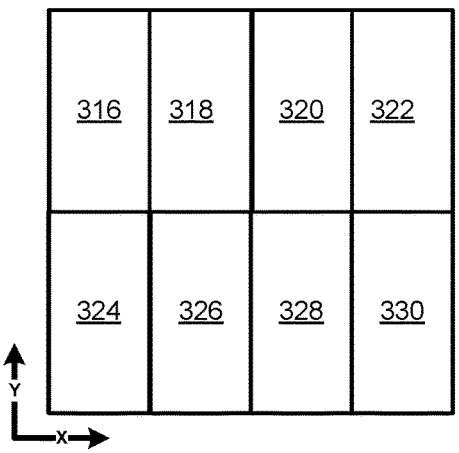

Referring now to FIG. 3H, the 2D geometric construct is divided into block 316, block 318, block 320, block 322, block 324, block 326, block 328 and block 330. In other words, block 314 is divided or partitioned by halving the 2D geometric construct within the x-axis. Block 328 and block 330 can each have a number of points within the boundaries of the block. The division of block 314 illustrated in FIG. 3H assumes block 314 includes some number of points above a threshold number of points (e.g., 2 points, 3 points and the like).

Figure 3J:
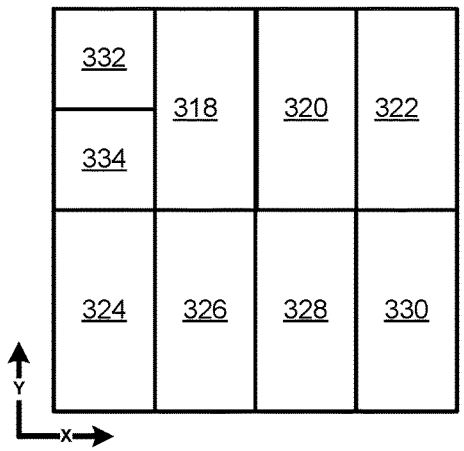

Referring now to FIG. 3J, the 2D geometric construct is divided into block 318, block 320, block 322, block 324, block 326, block 328, block 330, block 332 and block 334. In other words, block 316 is divided or partitioned by halving the 2D geometric construct within the y-axis. Block 332 and block 334 can each have a number of points within the boundaries of the block. The division of block 316 illustrated in FIG. 3J assumes block 316 includes some number of points above a threshold number of points (e.g., 2 points, 3 points and the like).

Figure 3K:
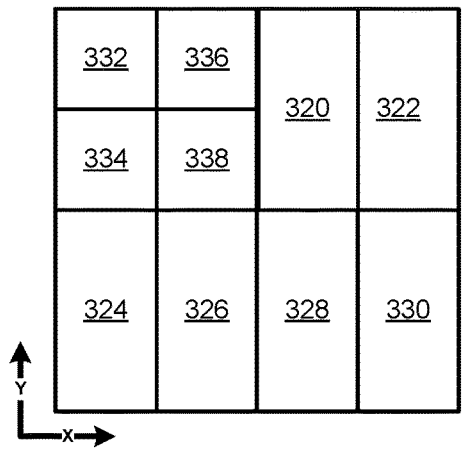

Referring now to FIG. 3K, the 2D geometric construct is divided into block 320, block 322, block 324, block 326, block 328, block 330, block 332, block 334, block 336 and block 338. In other words, block 318 is divided or partitioned by halving the 2D geometric construct within the y-axis. Block 336 and block 338 can each have a number of points within the boundaries of the block. The division of block 318 illustrated in FIG. 3K assumes block 318 includes some number of points above a threshold number of points (e.g., 2 points, 3 points and the like).

Figure 3L:
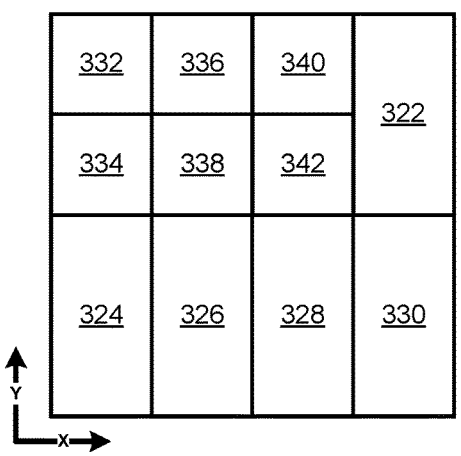

Referring now to FIG. 3L, the 2D geometric construct is divided into block 322, block 324, block 326, block 328, block 330, block 332, block 334, block 336, block 338, block 340 and block 342. In other words, block 320 is divided or partitioned by halving the 2D geometric construct within the y-axis. Block 340 and block 342 can each have a number of points within the boundaries of the block. The division of block 320 illustrated in FIG. 3L assumes block 320 includes some number of points above a threshold number of points (e.g., 2 points, 3 points and the like).

Figure 3M:
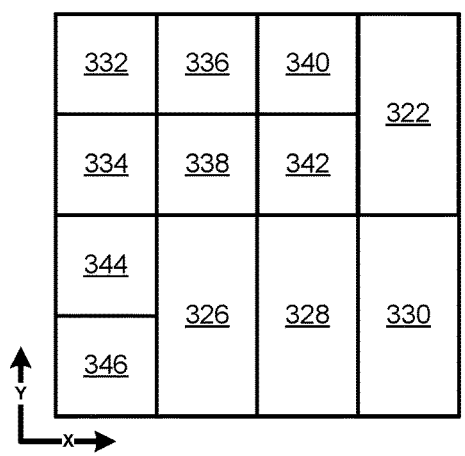

Referring now to FIG. 3M, block 322 is determined to have a number of points less than or equal to the threshold number of points (e.g., 2 points, 3 points and the like). For example, if the threshold number of points is two (2), block 322 has two (2) or less points within the boundary of the block. Therefore, processing moves to block 234 and the 2D geometric construct is divided into block 322, block 326, block 328, block 330, block 332, block 334, block 336, block 338, block 340 and block 342, block 344 and block 346. In other words, block 324 is divided or partitioned by halving the 2D geometric construct within the y-axis. Block 344 and block 346 can each have a number of points within the boundaries of the block. The division of block 324 illustrated in FIG. 3M assumes block 324 includes some number of points above a threshold number of points (e.g., 2 points, 3 points and the like). Although blocks 326-330 are not illustrated as being further divided, unless blocks 326-330 are empty or include less than or equal to the threshold number of points, blocks 326-330 would be further divided as the recursive algorithm continues. In other words, further description of the recursive algorithm as applied to blocks 326-330 would repeat the above implementation and is not further described for the sake of brevity.

FIGS. 4A-4F illustrate another recursive k-D tree representation of a two dimensional (2D) geometric construct according to at least one example embodiment. The Example embodiment described with regard to FIGS. 4A-4F could be implemented as depth first recursion (e.g., as described with regards to FIGS. 2A-2K) or a breadth first recursion (e.g., as described with regards to FIGS. 3A-3M). Further, in this example implementation instead of first dividing or partitioning along the x-axis and then the y-axis, the axis of division is selected to optimally partition the 2D geometric construct.

The 2D geometric construct can be optimally partitioned based on a point (or a number of points) differential. In an example implementation, a number of points in each of two blocks is determined if the partition were to be divided within the x-axis and a number of points in each of two blocks is determined if the partition were to be divided within the y-axis and so forth for each axis of the geometric construct. Then, a difference between the number of points in each of two blocks is determined for the x-axis and a difference between the number of points in each of two blocks is determined for the y-axis and so forth for each axis of the geometric construct. The axis having the greatest point differential is then selected as the axis to divide. Note is steps S120 and S125 a deviation value is generated and stored. In this implementation the number of points may be stored not the deviation value and/or the deviation value is generated and stored. Further, either generated block can include the points that a corresponding number is stored for so long as the associated decoder selects the same block. In other words, the encoder and decoder use the same (e.g., left, right, top, bottom, and the like) block.

Figure 4A:
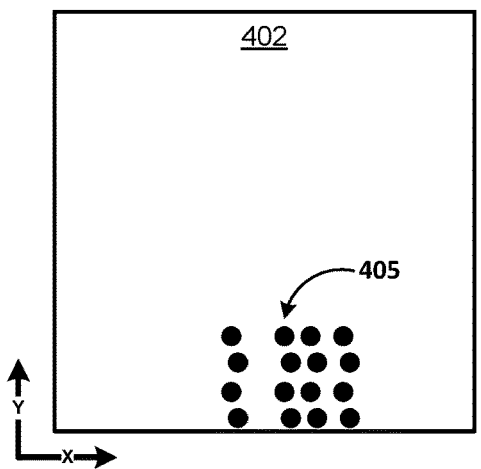
FIGS. 4A-4F illustrate still another recursive k-D tree representation of a two dimensional (2D) geometric construct according to at least one example embodiment.

FIG. 4A illustrates the 2D geometric construct as a block 402 having an x-axis and a y-axis. The block 402 includes a point cloud 405 having a number of points. Each dot in the point cloud 405 can represent at least one point. For example each dot could represent 100 points. Therefore, for illustrative purposes, the number of points in the point cloud 405 could be 16×100 or 1600.

Although block 402 is illustrated as being two dimensional, example embodiments are not limited thereto. Instead, block 402 and the corresponding point cloud could be three dimensional, four dimensional, five dimensional, six dimensional and so forth. In other words, the corresponding point cloud could be and the corresponding geometric construct can be a two or more dimensional shape. For example, block 402 and the corresponding point cloud 405 could be generated using a three dimensional laser scan. Therefore, block 402 and the corresponding point cloud 405 could include an x-axis, a y-axis and a z-axis (representing depth). Further, the laser scan could be a color laser scan. Accordingly, there may also be a RGB representation each having a corresponding axis in block 402 and the corresponding point cloud 405 could be totaling six axis or six dimensions. Therefore, although the following description is of a two dimensional geometric construct for the sake of brevity, it will be understood that additional dimensions are within the scope of this disclosure.

The block 402 can contain the point cloud 405 having the number of points. Further, the points can be quantized such that the points are represented by positive integers with at most b bits, where b is the number of desired quantization bits. Therefore, the x-axis can have $2^b$ unique values and the y-axis can have $2^b$ unique values. The point cloud can include any number of points. The number of points can be a relatively large number (e.g., in the millions, tens of millions and the like).

Figure 4B:
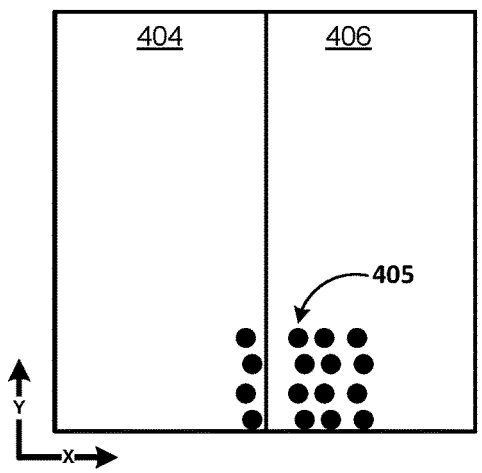

Using the technique described above with regards to FIGS. 2A-2K or as described above with regards to FIGS. 3A-3M, Referring now to FIG. 4B, the 2D geometric construct would be divided or partitioned by halving the 2D geometric construct within the x-axis. This would have resulted dividing block 402 into partition or block (hereinafter block) 404 and block 406. As shown in FIG. 4B, block 404 and block 406 each have a number of points within the boundaries of the block.

Figure 4C:
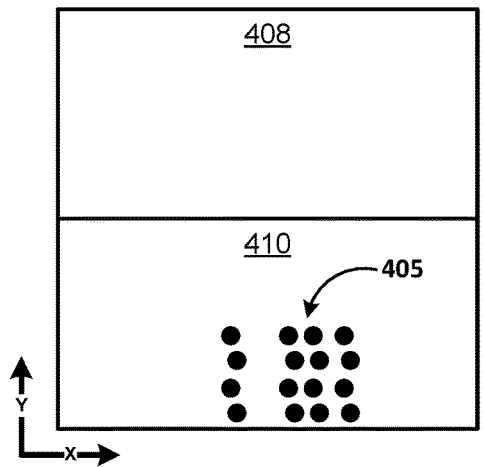

However, according to this example embodiment block 402 is partitioned based on a point (or a number of points) differential between block 404 and block 406 as shown in FIG. 4B compared to block 408 and block 410 as shown in FIG. 4C. In this example, block 404 has 400 points and block 406 has 1200 points. Therefore, the point differential between block 404 and block 406 is 800. In this example, block 408 has zero (0) points and block 410 has 1600 points. Therefore, the point differential between block 408 and block 410 is 1600. Therefore, according to this example implementation, the 2D geometric construct would be divided or partitioned by halving the 2D geometric construct within the y-axis as is illustrated in FIG. 4C.

The division of block 402 illustrated in FIG. 4C assumes block 402 includes some number of points above a threshold number of points (e.g., 2 points, 3 points and the like) in this example 1600 points. Further, because block 408 is empty or has less than the threshold number of points, the block 408 will not be further divided (as in FIGS. 2A-2K and FIGS. 3A-3M described above).

In example implementations, the recursive division, using the k-D tree algorithm, divides the 2D construct moves to divide along a next axis (e.g., switches from the y-axis to the x-axis). However, instead of just halving the 2D geometric construct within the next axis (e.g., the x-axis) a determination is made as to whether or not a point differential between blocks generated should the x-axis be divided is compared to a point differential between blocks generated should the y-axis be divided results in the axis being switched again (from the x-axis to the y-axis) using the current technique.

Figure 4D:
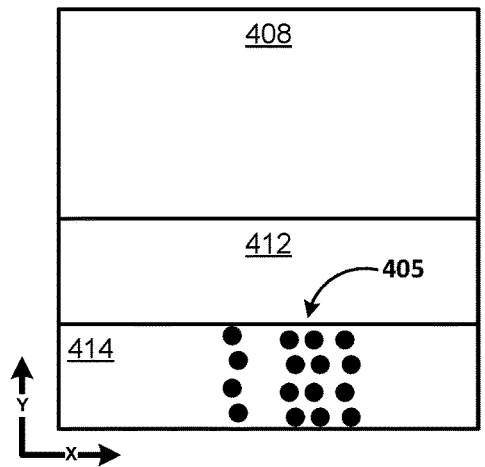

Referring now to FIG. 4D, the 2D geometric construct is divided into block 408, block 412 and block 414. In other words, block 410 is divided or partitioned by halving the 2D geometric construct within the y-axis. As is illustrated the point differential between block 412 and block 414 is 1600 (as compared to 800 should the x-axis be divided). Therefore, the division in FIG. 4D is within the y-axis. Further, because block 412 is empty or has less than the threshold number of points, block 412 will not be further divided.

Again, instead of just halving the 2D geometric construct within the next axis (e.g., the x-axis) a determination is made as to whether or not a point differential between blocks generated should the x-axis be divided is compared to a point differential between blocks generated should the y-axis be divided results in the axis being switched again (from the x-axis to the y-axis) using the current technique.

Figure 4E:
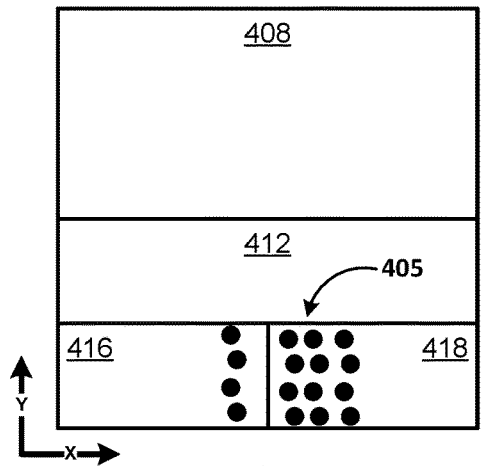

Referring now to FIG. 4E, the 2D geometric construct is divided into block 408, block 412, block 416 and block 418. In other words, block 414 is divided or partitioned by halving the 2D geometric construct or block 414 within the x-axis. Block 416 and block 418 can each have a number of points within the boundaries of the block. The number of points in each block can vary based on the position of the points along the x-axis. As is illustrated the point differential between block 416 and block 418 is 800 (as compared to zero (0) should the y-axis be divided). Therefore, the division in FIG. 4E is within the x-axis.

Once again, instead of just halving the 2D geometric construct within the next axis (e.g., the y-axis) a determination is made as to whether or not a point differential between blocks generated should the x-axis be divided is compared to a point differential between blocks generated should the y-axis be divided results in the axis being switched again (from the y-axis to the x-axis) using the current technique.

Figure 4F:
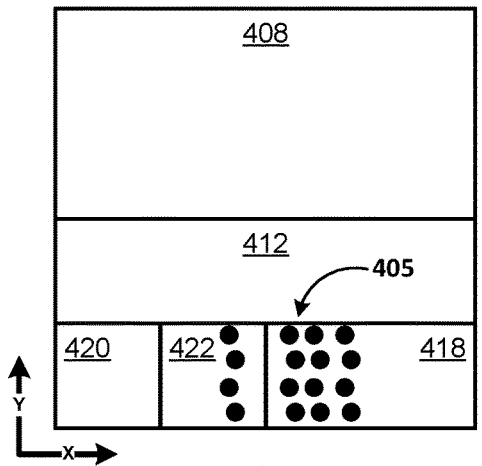

Referring now to FIG. 4F, the 2D geometric construct is divided into block 408, block 412, block 418, block 420 and block 422. In other words, block 416 is divided or partitioned by halving the 2D geometric construct or block 416 within the x-axis. The number of points in each block can vary based on the position of the points along the x-axis. As is illustrated the point differential between block 420 and block 422 is 400 (as compared to zero (0) should the y-axis be divided). Therefore, the division in FIG. 4F is within the x-axis. Further, because block 420 is empty or has less than the threshold number of points, block 420 will not be further divided.

Further recursive iterations using the depth first recursion (e.g., as described with regards to FIGS. 2A-2K) or the breadth first recursion (e.g., as described with regards to FIGS. 3A-3M) and optimizing the selection an axis to divide or partition block 418 and block 422 would continue as describe with regard to FIGS. 4A-4F. However, further description is omitted for the sake of brevity.

The Example embodiment described with regard to FIGS. 2A-2K, FIGS. 3A-3M and FIGS. 4A-4F implement three mechanisms for dividing the geometric structure including the point cloud. However, example embodiments are not limited thereto so long as an encoder and decoder utilize a same mechanism to partition and rebuild the geometric structure and/or point cloud.

Figure 5A:
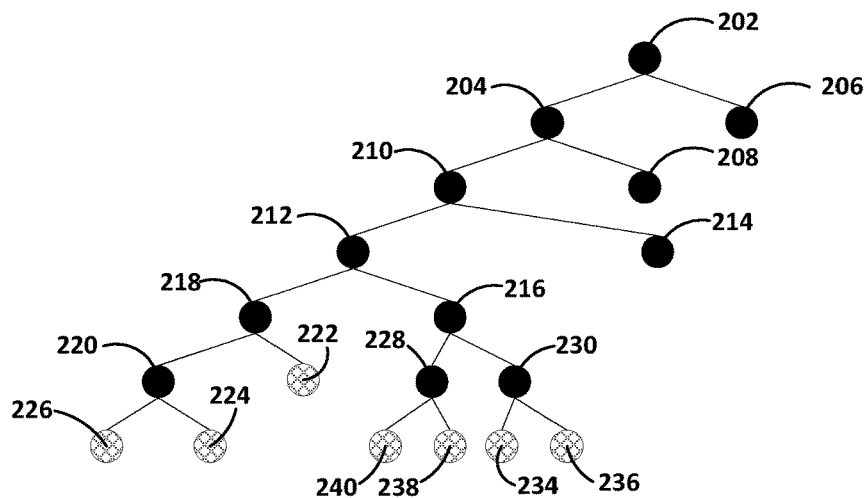
FIGS. 5A-5C illustrate a nodal representation of the k-D tree according to at least one example embodiment.

FIG. 5A illustrates a nodal representation of the k-D tree described above with regard to FIGS. 2A-2K according to at least one example embodiment. Generating the nodes follows the same process as described with regard to FIGS. 2A-2K and therefore will not be described further. Further, the nodes in FIG. 5A are shown as having the same label as the blocks from FIGS. 2A-2K. Branching nodes (e.g., node or block 218) are illustrated as solid whereas leaf nodes (e.g., node or block 222) are shown as hashed. Nodes 206, 208 and 214 may include edges to child nodes should the blocks 206, 208 and 214 include greater than the threshold number of points, because blocks 206, 208 and 214 would be further divided as the recursive algorithm continues described with regard to FIGS. 2A-2K.

Figure 5B:
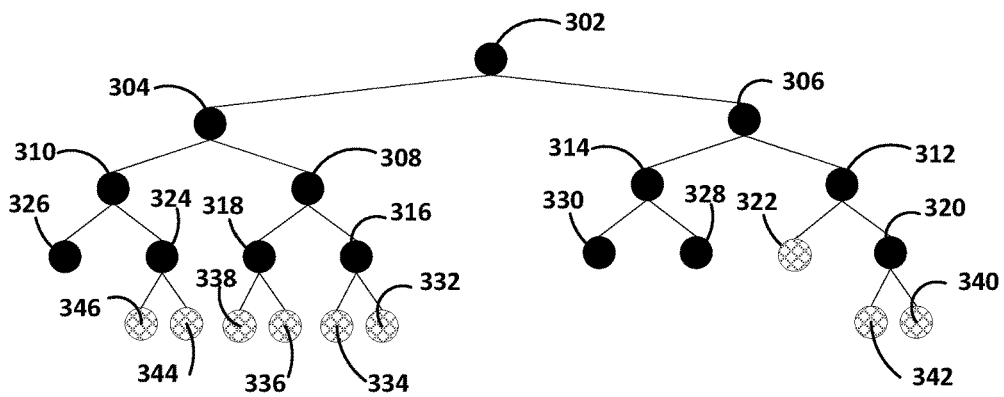

FIG. 5B illustrates a nodal representation of the k-D tree described above with regard to FIGS. 3A-3M according to at least one example embodiment. Generating the nodes follows the same process as described with regard to FIGS. 3A-3M and therefore will not be described further. Further, the nodes in FIG. 5B are shown as having the same label as the blocks from FIGS. 3A-3M. Branching nodes are illustrated as solid whereas leaf nodes are shown as hashed. Nodes 326, 328 and 330 may include edges to child nodes should the blocks 326, 328 and 330 include greater than the threshold number of points, because blocks 326, 328 and 330 would be further divided as the recursive algorithm continues described with regard to FIGS. 3A-3M.

Figure 5C:
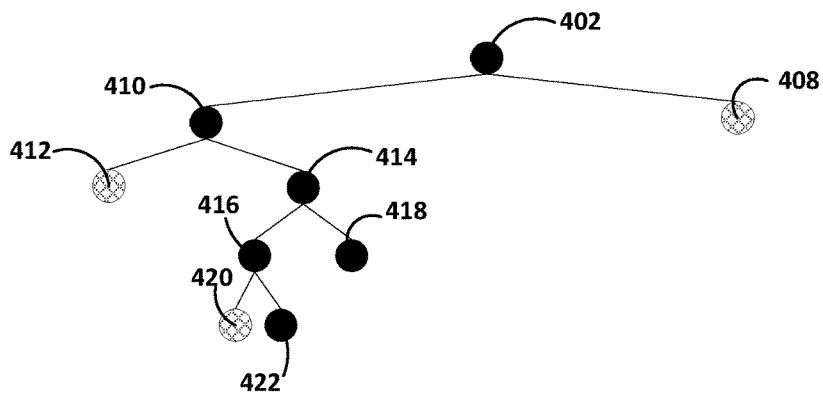

FIG. 5C illustrates a nodal representation of the k-D tree described above with regard to FIGS. 4A-4F according to at least one example embodiment. Generating the nodes follows the same process as described with regard to FIGS. 4A-4F and therefore will not be described further. Further, the nodes in FIG. 5C are shown as having the same label as the blocks from FIGS. 4A-4F. Branching nodes are illustrated as solid whereas leaf nodes are shown as hashed. Nodes 418 and 422 may include edges to child nodes should the blocks 418 and 422 include greater than the threshold number of points (as is illustrated in FIG. 4F), because blocks 418 and 422 would be further divided as the recursive algorithm continues described with regard to FIGS. 4A-4F.

FIGS. 6A-6C illustrate buffers according to at least one example embodiment. The buffer illustrated in FIG. 6A is configured to store a deviation value corresponding to the number of points in a block (e.g., as an integer of length $\log_2(N)$ where N is the number of points in the parent block) including a number of points greater than the threshold number of points. The buffer illustrated in FIG. 6B is configured to store data related to a leaf node or block including a number of points less than or equal to the threshold number of points. The data represents the unknown or remaining bits used to determine the position of the point (e.g., coordinates of the point in the block or leaf node). The buffer illustrated in FIG. 6C is configured to store data indicating an axis of division. In an implementation using the techniques described with regard to FIGS. 2A-2K and/or FIGS. 3A-3M, but not the techniques described with regard to FIGS. 4A-4F, the buffer illustrated in FIG. 6C may not be needed and could be optional or used as a design or execution option. For example, inclusion of the buffer illustrated in FIG. 6C could trigger a decoder (e.g., decoder 1005) to use the technique described with regard to FIGS. 4A-4F.

The buffer illustrated in FIG. 6A can store a deviation value corresponding to a number of points or a value that can be used to determine a number of points. In an example implementation, NP-202 and NP-204 can be a value used to determine a number of points. NP-202 and NP-204 can be a deviation value (e.g., from a predicted value or reference value). A predicted value or reference value can be based on a number of points in a parent block. For example, block 202 is a parent block for block 204. If block 202 has N points, the predicted value or reference value for block 204 is N/2, and if the number of points in block 204 is p, then the deviation value stored as NP204 is N/2−p. The size of (e.g., memory used to store or number of bits used to store) each value stored in the buffer can be based on the maximum value that could be stored in the buffer. In other words, the amount of memory used to store a deviation value can be based on the number of points in the parent block because the maximum number of points in a child block can be no more than the number of points in the parent block.

The buffer illustrated in FIG. 6B can store a number representing a coordinate of a point based on a block boundary associated with a leaf node in the k-D tree. The number can be the remaining or unknown (e.g., undeterminable based on the k-D tree algorithm) bits of the coordinates representing a point in the leaf node in the k-D tree. For example, as the k-D tree is recursively partitioned, a bit string corresponding to the lower corner of the partition (along the x or y axis) is determinable based on the algorithm. In other words, a bit value representing the x-coordinate of the lower left corner of a block can be determined in the 2D geometric construct described with regard to FIGS. 2A-2K, FIGS. 3A-3M and/or FIGS. 4A-4F based on the k-D tree algorithm used with regard to the corresponding figures. Then, the x-coordinate of the point in the block is some value p that is greater than the x-coordinate of the lower left corner of the block. The bits representing the x-coordinate of the lower left corner of the block can be stripped from the bits representing p. The result is then stored in the buffer illustrated in FIG. 6B.

For example, along the x-axis block 226 has a lower bound of 0 and an upper bound that is the midpoint (mp) of block 218. Therefore, a point p in block 226 can have a value on the bound 0 up to and not including a value representing the midpoint (mp) of block 218. In an example implementation, the first L bits of a coordinate of a point in the block correspond to the first L bits of the coordinate of the lower left corner of the block, where L is the number of times the algorithm has subdivided the corresponding axis. Accordingly, in order to encode a coordinate of a point, the remaining b-L bits of that coordinate are encoded because the leading L bits are known from the lower left corner of the block. As such, the decoder can determine the coordinate of a point by taking the first L bits from the lower corresponding coordinate of the lower left corner of the corresponding block (e.g., the block the point is in) and using the remaining b-L bits from the buffer (e.g., the buffer illustrated in FIG. 6B) to calculate the coordinate for the point. In an example implementation, the buffer illustrated in FIG. 6B can store bits (binary, hex and the like) representing the remaining b-L bits.

The buffer illustrated in FIG. 6C can store a value corresponding to or indicating an axis to divide. In an example implementation, A1, A2, A3, A4, A5 and A6 can be a value used (e.g., by a decoder) to indicate an axis switch. An algorithm (e.g., k-D tree algorithm) used to partition the geometric construct may select a next axis to partition in a determinable order. For example, in a 3D implementation, the k-D tree algorithm may select an axis in an x-axis, y-axis, z-axis order. In other words, if the last iteration divided within the y-axis, the decoder selects the z-axis as the next axis to divide within. However, the technique described with regard to FIGS. 4A-4F a different axis could have been divided. Therefore, the decoder can use the value (e.g., A1) stored in buffer illustrated in FIG. 6C to select a different axis.

In an example implementation, a value of 0 indicates the selected axis (e.g., the next axis in the x-axis, y-axis, z-axis order) does not change, a value of 1 indicates the selected axis should switch to the next axis (e.g., from the x-axis to the y-axis), and a value of 2 indicates the selected axis should switch to the next by one axis (e.g., from the x-axis to the z-axis). Accordingly, a 4D point cloud could use 0, 1, 2, a 5D point cloud could use 0, 1, 2, 3, and so forth. In an example implementation, the buffer illustrated in FIG. 6C can store bits (binary, hex and the like) representing an axis selection as a number of axis switches.

FIG. 7 illustrates a method for decoding data according to at least one example embodiment. As shown in FIG. 7, in step S705 an encoded geometric data file is received. The data file may include data encoded using the aforementioned techniques. The data file may include two types of encoded data. For example, the data file may include data representing a number of points in a portion, region or block of a geometric construct representing a point cloud, and the data file may include data representing a position (e.g., a coordinate) of a point in a portion, region or block of a geometric construct representing a point cloud.

In step S710 a first buffer and a second buffer are loaded using data from the encoded geometric data file. For example, the first buffer can include the data representing a number of points in a portion, region or block of a geometric construct representing a point cloud. Further, the second buffer can include data representing a position (e.g., a coordinate) of a point in a portion, region or block of a geometric construct representing a point cloud.

In step S715 the first buffer is entropy decoded. For example, an inverse Huffman or an inverse Arithmetic codec can be used to decode each of the values in the first buffer. The resultant decoded values can be delta values or deviation values. Therefore, decoding the first buffer can further include converting the delta values or deviation values. The converted values can represent the number of points in a portion, region or block of a geometric construct representing a point cloud. Converting the delta values or deviation values can include determining a reference value used (by a corresponding encoder to calculate corresponding delta values or deviation values) and using the reference value to determine or calculate reconstructed values. The reference value is N/2 as described above.

In step S720 the first entry in the first buffer is inserted into a geometric construct. For example, geometric construct can be the 2D construct described below with regard to FIGS. 2A-2K, FIGS. 3A-3M and/or FIGS. 4A-4F. In other words, the geometric construct can be the geometric construct represented by block 202 and/or block 302 which can include a corresponding point cloud. The geometric construct could be three dimensional, four dimensional, five dimensional, six dimensional and so forth. In an example implementation, the first entry (e.g., a number of points) from buffer 1020 (described below) is inserted into the geometric construct. The first entry can be a value representing a total number of points in the point cloud. Therefore, placing the first entry in the first buffer into the geometric construct can be the equivalent of placing the total number of points corresponding to the point cloud into the geometric construct.

In step S725 a partition in the geometric structure is selected. In a first iteration, the geometric construct includes the total number of points corresponding to the point cloud in a single (or whole) partition. In subsequent iterations, a child partition is selected. For example, in the first iteration, the decoder can select block 202 or block 302 as described above. In the subsequent iterations, block 204, block 304, block 208, block 308 and so forth can be selected. Selection of the partition or block can be based on a k-D tree algorithm. In other words, of the partition or block can be based on the k-D tree techniques described above with regard to FIGS. 2A-2K (e.g., depth first) and/or FIGS. 3A-3M (e.g., breadth first). In addition, the decoder selects the same k-D tree technique as used by the encoder. In an example implementation, a header associated with a data packet including compressed data (or a portion thereof) can include information associated with the k-D tree technique used by the encoder to compress the data for the point cloud.

In step S735 whether or not the partition includes more than a threshold number of points is determined. If the partition (or block) includes more than the threshold number of points, processing continues to step S740. If the partition (or block) does not include more than the threshold number of points, processing continues to step S735. In an example implementations, the threshold number of points (e.g., 2 points, 3 points and the like) can be the number of points in the block or partition including points on the lower (e.g. the left and bottom boundaries shown in FIGS. 2A-2K, FIGS. 3A-3M and/or FIGS. 4A-4F) boundaries. In the first iteration the partition is the geometric construct and should result in a yes for step S735.

In step S735 data from the second buffer is inserted in the partition. The second buffer (e.g., buffer 1025 and/or the buffer illustrated in FIG. 6B) stores data associated with a leaf node or block (e.g., node or block 222, node or block 322 and the like). Accordingly, if the node or block has less than or equal to the threshold number of points, the node or block is a leaf node or block. In an example implementation, the second buffer can store bits (binary, hex and the like) representing the remaining b-L bits, where the leading L bits are known from the lower left corner of a corresponding block. As such, the decoder can determine the coordinate of a point by taking the first L bits from the lower corresponding coordinate of the lower left corner of the corresponding block (e.g., the block the point is in) and use the remaining b-L bits from the second buffer to calculate the coordinate for the point.

In step S740 the partition is divided. As shown in FIGS. 2A-2K, FIGS. 3A-3M and/or FIGS. 4A-4F, according to the k-D tree techniques the selected partition is divided in half. Then, in step S745 a number of points corresponding to a value in the first buffer are inserted in one of the resultant partitions. For example, referring to FIGS. 2C and 2D, if block 210 is selected and has more than the threshold number of points, block 210 is divided into partitions 212 and 214 and a number of points corresponding to a value in the first buffer are inserted into block 212.

The value in the first buffer can be a deviation value corresponding to a number of points or a value that can be used to determine the number of points to be inserted in the block. The deviation value can be based on a predicted value or reference value. A predicted value or reference value can be based on a number of points in a parent block. If a parent block has N points, the predicted value or reference value for a child block is N/2, and if the deviation value stored as the value in the first buffer is N/2−p, the p (the number of points in the block) is equal to the value in the first buffer plus N/2. Continuing the above example, N/2 is the number of points in block 210 divided by 2 and the number of points inserted into block 212 equals the number of points in block 210 divided by 2 plus the deviation value read from the first buffer.

In step S750 a number of points equal to a value in the first buffer are removed from a parent partition. For example, a number of points equal to the number of points inserted in block 212 are removed from block 210. In step S755 whether all points are inserted is determined. If all points are inserted, processing continues to step S760 and processing or decoding ends. Otherwise processing returns to step S725.

Figure 8A:
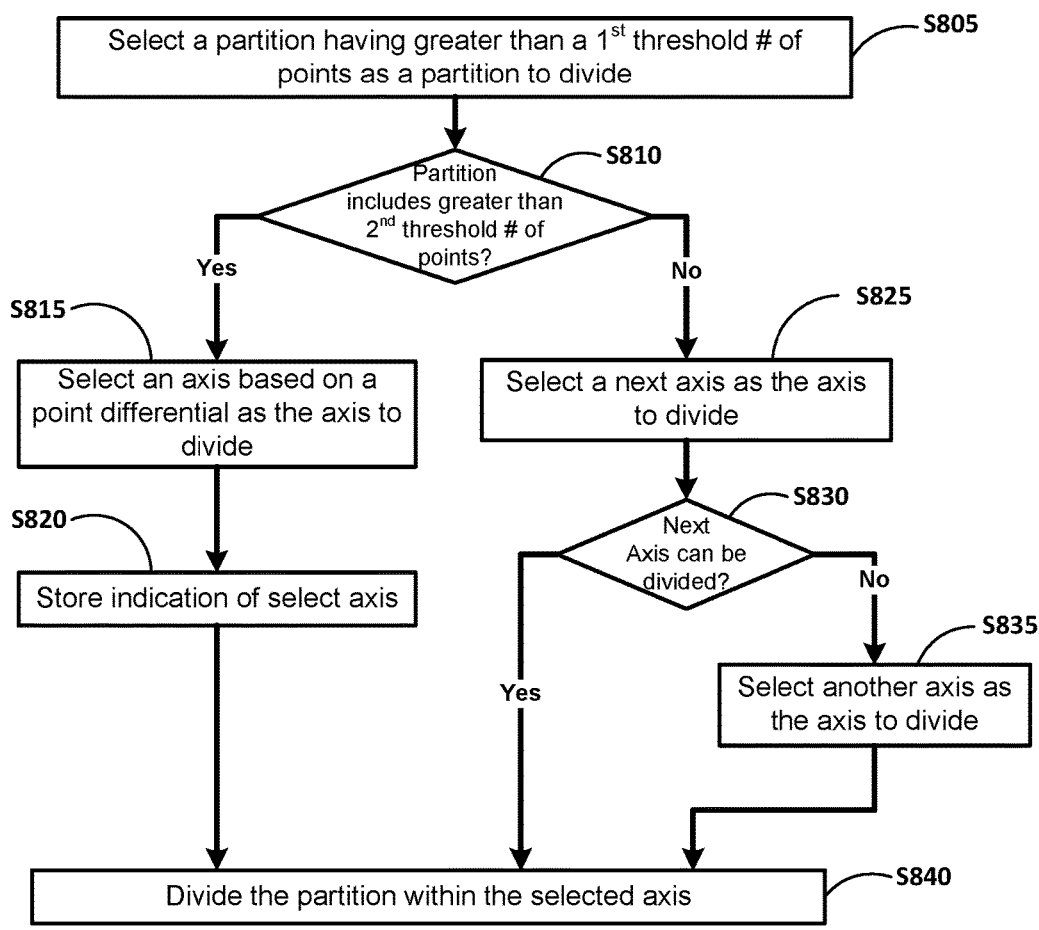
FIGS. 8A and 8B illustrate methods for selecting an axis to divide according to at least one example embodiment.
Figure 8B:
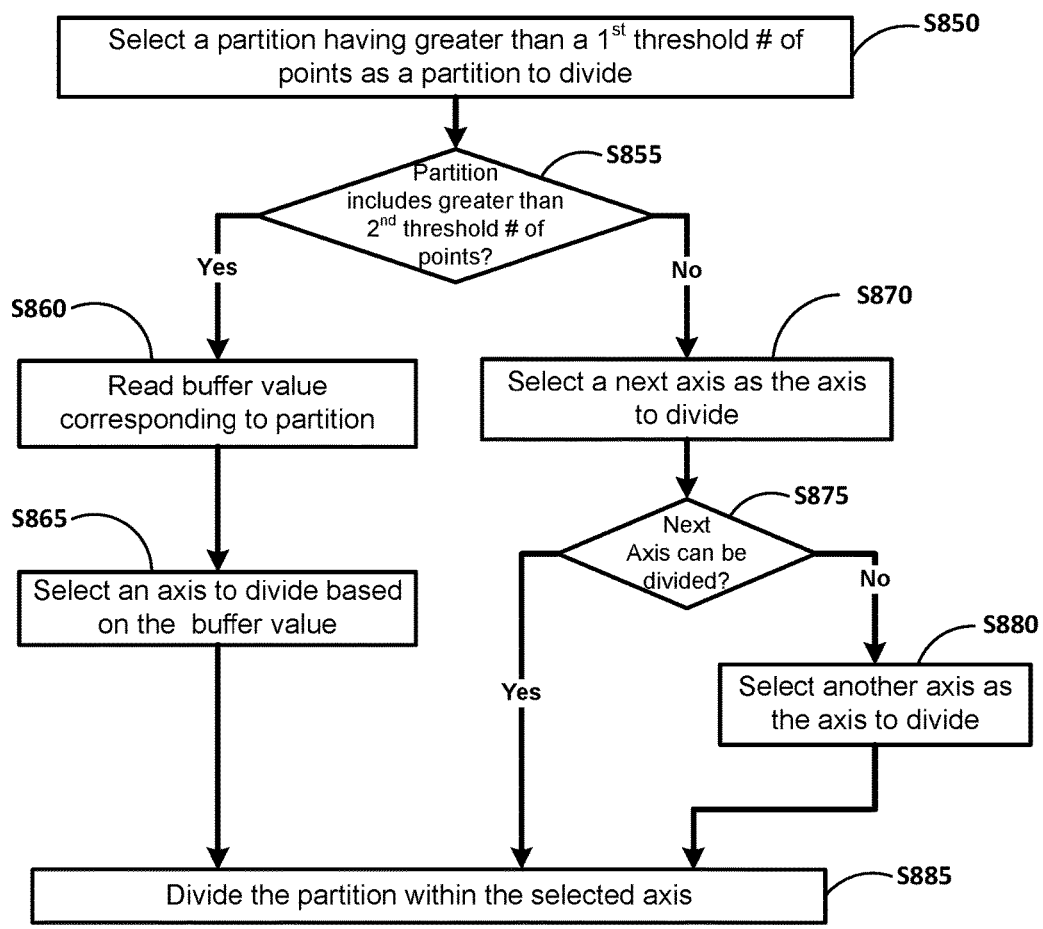

FIGS. 8A and 8B illustrate methods for selecting an axis to divide according to at least one example embodiment. As shown in FIG. 8A, in step S805 a partition (of a geometric construct including a point cloud) having greater than a first threshold number of points is selected as a partition to divide. For example, block 402 illustrated in FIG. 4A can be selected. The first threshold number of points can be the threshold number of points (e.g., 2 points, 3 points and the like) described above with regard to FIGS. 2A-2K, FIGS. 3A-3M. In other words, selecting a partition as a partition to divide can be performed while recursively partitioning the geometric construct as described above in step S110 of FIG. 1 where the selected partition includes greater than the threshold number of points (e.g., 2 points, 3 points and the like).

In step S810 whether or not the selected partition includes greater than a second threshold number of points is determined. Upon determining the partition includes greater than a second threshold number of points, processing continues to step S815. The second threshold number of points can be a number of points greater than the first threshold number of points. For example, if the first threshold number of points is two (2) points, the second threshold number of points can be 64 points. The value of the first threshold number of points and the second threshold number of points can be design choices. However, the first threshold number of points should be less than the second threshold number of points. Referring again to block 402 illustrated in FIG. 4A, each dot in the point cloud 405 can represent at least one point. For example each dot could represent 100 points. Therefore, the number of points in the point cloud 405 could be 1600. If the first threshold number of points is two (2) points and the second threshold number of points can be 64 points block 402 has a number of points greater than the first threshold and greater than the second threshold.

In step S815 an axis is selected as the axis to divide based on a point (or a number of points) differential. In an example implementation, a number of points in each of two blocks is determined if the partition were to be divided within the x-axis and a number of points in each of two blocks is determined if the partition were to be divided within the y-axis and so forth for each axis of the geometric construct. Then, a difference between the number of points in each of two blocks is determined for the x-axis and a difference between the number of points in each of two blocks is determined for the y-axis and so forth for each axis of the geometric construct. The axis having the greatest point differential is then selected as the axis to divide. Referring to block 402 illustrated in FIG. 4B, should block 402 be divided within the x-axis, block 404 would include 400 points and block 406 would include 1200 points (assuming each dot represents 100 points). Further, referring to block 402 illustrated in FIG. 4B, should block 402 be divided within the y-axis, block 408 would include zero (0) points and block 410 would include 1600 points. Therefore, in step S815, the y-axis would be selected as the axis to divide.

In step S820 an indication of the selected axis is stored. The indication of the selected axis can be stored in a buffer. For example the indication of the selected axis the buffer shown in FIG. 6C or buffer 1040. The indication can be a value that indicates the axis is to be switched. For example a value of 0 can indicate the default axis, a value of 1 can be switch to the next axis in order (e.g., from the x-axis to the y-axis) and so forth.

Returning to step S810, upon determining the partition includes less than or equal to the second threshold number of points, processing continues to step S825. In step S825 the next axis (e.g., in a defined or algorithm order) is selected as the axis to divide. For example, if the previous axis that was divided was the x-axis, the next axis could be the y-axis, if the previous axis that was divided was the y-axis, the next axis could be the x-axis (in a 2D geometric construct) or the next axis could be the z-axis (in a 3D geometric construct) and so forth. Then, in step S830 whether or not the next axis can be divided is determined. Upon determining the next axis can be divided, processing continues to step S840. As discussed above each axis of the geometric construct can have a b-bit long integer representation. Accordingly, the point cloud can be represented by positive integers with at most b bits, where b is the number of desired quantization bits (precision=$(½)^b$). Therefore, in an example implementation, the next axis can be divided if the number of bits representing a point in the corresponding partition for that axis is two (2) or more bits.

Returning to step S830, upon determining the next axis can not be divided, processing continues to step S835. In step S835 another axis is selected as the axis to divide. For example, if the next axis was selected as the x-axis, the y-axis (e.g., sequentially next in a defined or algorithm order) could be selected as the axis to divide.

In step S840 the partition is divided within the selected axis to divide. Continuing the example, block 402 is divided within the y-axis which generates block 408 and 410. The steps described above with regard to FIG. 8A could be implemented within step S110 of FIG. 1 as a further refinement of the method for encoding data described with regard to FIG. 1. The method being implemented in an encoder (e.g., encoder 905). Further, the steps of FIG. 8A can be repeated each time a new block or partition is selected to be divided within the process of recursively partitioning the geometric construct as described above in step S110 of FIG. 1.

As shown in FIG. 8B, in step S850 a partition (of a geometric construct including a point cloud) having greater than a first threshold number of points is selected as a partition to divide. For example, block 402 illustrated in FIG. 4A can be selected. The first threshold number of points can be the threshold number of points (e.g., 2 points, 3 points and the like) described above with regard to FIGS. 2A-2K, FIGS. 3A-3M. In other words, selecting a partition as a partition to divide can be performed as a routine within step S740 where the selected partition includes greater than the threshold number of points (e.g., 2 points, 3 points and the like) as determined in step S730.

In step S855 whether or not the selected partition includes greater than a second threshold number of points is determined. Upon determining the partition includes greater than a second threshold number of points, processing continues to step S860. The second threshold number of points can be a number of points greater than the first threshold number of points. For example, if the first threshold number of points is two (2) points, the second threshold number of points can be 64 points. The value of the first threshold number of points and the second threshold number of points can be design choices. However, the first threshold number of points should be less than the second threshold number of points. Referring again to block 402 illustrated in FIG. 4A, each dot in the point cloud 405 can represent at least one point. For example each dot could represent 100 points. Therefore, the number of points in the point cloud 405 could be 1600. If the first threshold number of points is two (2) points and the second threshold number of points can be 64 points block 402 has a number of points greater than the first threshold and greater than the second threshold.

In step S860 For example, a buffer (e.g., as shown in FIG. 6C or buffer 1040) can be read. In step S865 an axis to divide is selected based on the buffer value. Continuing the above example, the buffer value indicates the axis is to be switched from the axis selected (e.g., in a defined or algorithm order). For example, if the previous axis that was divided was the x-axis, the next axis could be the y-axis, if the previous axis that was divided was the y-axis, the next axis could be the x-axis (in a 2D geometric construct) or the next axis could be the z-axis (in a 3D geometric construct) and so forth. As shown in FIG. 4C, this results in selecting the y-axis as the axis to divide.

Returning to step S855, upon determining the partition includes less than or equal to the second threshold number of points, processing continues to step S870. In step S870 the next axis (e.g., in a defined or algorithm order) is selected as the axis to divide. For example, if the previous axis that was divided was the x-axis, the next axis could be the y-axis, if the previous axis that was divided was the y-axis, the next axis could be the x-axis (in a 2D geometric construct) or the next axis could be the z-axis (in a 3D geometric construct) and so forth. Then, in step S875 whether or not the next axis can be divided is determined. Upon determining the next axis can be divided, processing continues to step S885. As discussed above each axis of the geometric construct can have a b-bit long integer representation. Accordingly, the point cloud can be represented by positive integers with at most b bits, where b is the number of desired quantization bits (precision=$(½)^b$). Therefore, in an example implementation, the next axis can be divided if the number of bits representing a point in the corresponding partition for that axis is two (2) or more bits.

Returning to step S875, upon determining the next axis can not be divided, processing continues to step S880. In step S880 another axis is selected as the axis to divide. For example, if the next axis was selected as the x-axis, the y-axis (e.g., sequentially next in a defined or algorithm order) could be selected as the axis to divide.

In step S885 the partition is divided within the selected axis to divide. Continuing the example, block 402 is divided within the y-axis which generates block 408 and 410. The steps described above with regard to FIG. 8B could be implemented within step S740 of FIG. 7 as a further refinement of the method for decoding data described with regard to FIG. 7. The method being implemented in a decoder (e.g., decoder 1005). Further, the steps of FIG. 8B can be repeated each time a new block or partition is selected to be divided.

FIG. 9 illustrates an encoder according to at least one example embodiment. As shown in FIG. 9 an encoder 905 includes a quantization module 915, a k-D tree module 920, a deviation module 950, a buffer 925, a buffer 930, a buffer 955, an entropy encoder 935 and a file build module 940. The encoder 905 receives as an input geometric data 910 and outputs compressed bits 945 (or simply a file of compressed bits). Dotted lines in FIG. 9 illustrate data flow. The input geometric data 910 may be a real time stream of data (e.g., laser scan data, a video conference or a video chat). For example, the input geometric data 910 may be previously recorded or saved (e.g., a movie or a video recorder recording).

The quantization module 915 is configured to map or convert a range of values (e.g., float or double) to a single quantum value. In an example embodiment, quantization can convert the floats associated with a point cloud into a b-bit long integer representation. Accordingly, in a 2D point cloud, the x-axis can have $2^b$ unique values and the y-axis can have $2^b$ unique values. In a 3D point cloud, the x-axis can have $2^b$ unique values, the y-axis can have $2^b$ unique values and the z-axis can have $2^b$ unique values. In an example implementation, b can be any integer (e.g., based on a decode quality). For example, b can be 16 bits resulting in 65 k unique values. In an example implementation, the input (e.g., geometric data 910) is a b-bit long integer. Therefore, quantization may be redundant and as a result not necessary. Accordingly, processing performed by the quantization module can be skipped or optional.

The k-D tree module 920 is configured to generate a value (e.g., an integer) indicating a number of points in a portion, a region or a block of a geometric construct representing a point cloud. The k-D tree module 920 is further configured to generate a value (e.g., an integer) indicating a position (e.g., a coordinate) of a point in a portion, region or block of a geometric construct representing a point cloud. The k-D tree module 920 is configured to recursively generate at least one portion, region or block from a geometric construct representing a point cloud. For example, the k-D tree module 920 can implement the technique for partitioning a geometric construct including a point cloud as described above with regard to FIGS. 2A-2K, FIGS. 3A-3M and/or FIGS. 4A-4F.

The k-D tree module 920 can be configured to generate a delta value or deviation value for each of the values indicating the number of points in the portion, the region or the block of the geometric construct representing the point cloud. The k-D tree module 920 can be configured to generate a delta value or deviation value for each of the values indicating a position (e.g., a coordinate) of a point in a portion, region or block of a geometric construct representing a point cloud. In an example implementation, the k-D tree module 920 can determine the smallest coordinate in the portion, region or block of the geometric construct representing the point cloud. The delta value or deviation value can be determined or calculated based on the smallest coordinate. In other words, the smallest value can be t and the value can be i such that the delta value or deviation value can be calculated as i-t. The delta value or deviation value can be determined or calculated for each axis (e.g., x and y, x, y and z, and the like). Accordingly, the smallest value can be a corner of the portion, region or block of the geometric construct that includes the point. In an example implementation, the size of the smallest coordinate and the delta value or deviation value can be reduced by removing leading zeroes in the b-bit long integer representation of the smallest coordinate and the delta value or deviation value.

The k-D tree module 920 can be configured to generate a value corresponding to or indicating an axis to divide. In an example implementation, the value can indicate the algorithm (e.g., the technique described with regard to FIGS. 4A-4F) used by the k-D tree module 920 caused an axis division to deviate from a defined axis order. For example, in a 3D implementation, the k-D tree algorithm may select an axis in an x-axis, y-axis, z-axis order. In other words, if the last iteration divided within the y-axis, the algorithm used by the k-D tree module 920 selects the z-axis as the next axis to divide within. However, the technique described with regard to FIGS. 4A-4F a different axis could have been divided.

In an example implementation, the k-D tree module 920 generates a value of 0 indicating the selected axis (e.g., the next axis in the x-axis, y-axis, z-axis order) does not change, the k-D tree module 920 generates a value of 1 indicating the selected axis should switch to the next axis (e.g., from the x-axis to the y-axis), and the k-D tree module 920 generates a value of 2 indicating the selected axis should switch to the next by one axis (e.g., from the x-axis to the z-axis (skipping the y-axis)). Accordingly, a 4D point cloud could use 0, 1, 2, a 5D point cloud could use 0, 1, 2, 3, and so forth. In an example implementation, the value is communicated to buffer 955 and stored in buffer 955.

The buffer 925 is configured to store a plurality of values (e.g., an integer) each value indicating a number of points in a portion, region or block of a geometric construct representing a point cloud. The buffer 925 is configured to store the plurality of values (e.g., an integer) as deviation value to be entropy encoded. The buffer 930 is configured to store a plurality of values (e.g., an integer) each value indicating a position (e.g., a coordinate) of a point in a portion, region or block of a geometric construct representing a point cloud.

The buffer 955 can be configured to store a value corresponding to or indicating an axis to divide. The value can be received from the k-D tree module 920. In an example implementation, the value can indicate the algorithm used by the k-D tree module 920 caused an axis division (e.g., generation of partitions described above) to deviate from a defined axis order. Although not shown, buffer 955 can be entropy encoded. Therefore, the output of buffer 955 could be input into entropy encoder 935. In an implementation using the techniques described with regard to FIGS. 2A-2K and/or FIGS. 3A-3M, but not the techniques described with regard to FIGS. 4A-4F, the buffer 955 may not be needed and could be optional or used as a design or execution option.

The entropy encoder 935 is configured to entropy encode the plurality of values indicating a number of points in a portion, a region or block of the geometric construct representing a point cloud. The entropy encoder 935 can be configured to generate a delta value or deviation value for each of the values indicating the number of points in the portion, the region or the block of the geometric construct representing the point cloud. The delta value or deviation value for value x (where x is the number of points in a block or associated with a node in a k-D tree) can be x−m/2 where m/2 is the half the number of points of the parent block or of another block (e.g., block in which the block associated with value x is a partition of). The delta value or deviation value can then be entropy encoded. The delta value or deviation value can be encoded using a codec such as Huffman coding or arithmetic coding.

The file build module 940 is configured to generate a file based on a plurality of entropy encoded values, the plurality of values (e.g., an integer) each indicating a position (e.g., a coordinate) of a point and/or a plurality of values corresponding to or indicating an axis to divide. The generated file may include a header or other metadata including information about the point cloud, the encoding scheme (e.g., variables associated with the quantization module 915 and/or variables associated with the entropy encoder 935), the k-D tree and the like. The generated file may be stored in a local memory and/or communicated to another device (e.g., a device separate from and communicatively coupled to the device that encoded the point cloud data).

The deviation module 950 is configured to generate or calculate a deviation value based on the number of points in a partition. For example, a reference value can be determined as a number of points in a partition (e.g., parent partition or block) of a geometric construct (N) divided by two (N/2). In an example implementation, the reference value can be the number of points divided by two (N/2) of a parent block or node at which the block was divided into two portions (e.g., two blocks) or halved. For example, referring to FIGS. 2C and 2D, block 210 was divided or halved (e.g., split down the middle) to generate block 212 and 214. The reference value for block 212 and block 214 can be the number of points in block 210 divided by two (2). In an example implementation, the deviation module 950 could be a module included in the k-D tree module 920.

The deviation value can then be determined based on the reference value (N/2) and the data. For example, the deviation value for value p (where p is the number of points in a block or associated with a node in the k-D tree) can be p−N/2 where N/2 is the reference value (e.g., the number of points in the parent block divided by two). Continuing the above example, the deviation value for block 212 can be NP-212−(NP-210/2). Deviation values should be smaller (e.g., have more leading zero's in b-bit integer) than the actual value p.

FIG. 10 illustrates a decoder according to at least one example embodiment. As shown in FIG. 10 a decoder 1005 includes a file deconstruct module 1010, an entropy decoder 1015, a buffer 1020, a buffer 1025, a buffer 1040, a geometric construct module 1030 and a de-quantization module 1035. The decoder 1005 receives as compressed bits 945 (or simply a file of compressed bits) and outputs geometric data. Dotted lines in FIG. 10 illustrate data flow. The geometric data 910 may correspond to a reconstructed stream of data (e.g., laser scan data, a video conference or a video chat).

The file deconstruct module 1010 can be configured to receive a file including encoded or compressed bits representing a stream of data corresponding to a point cloud. The encoded or compressed bits having been previously encoded using a recursive partitioning of a geometric construct including a point cloud. The file deconstruct module 1010 can be configured to determine at least two streams of encoded data. A first stream of data corresponding to a plurality of values (e.g., an integer) each value indicating a number of points in a portion, region or block of the geometric construct. A second stream of data corresponding to a plurality of values (e.g., an integer) each value indicating a position (e.g., a coordinate) of a point in a portion, region or block of a geometric construct representing a point cloud. A third stream of data including values corresponding to or indicating an axis to divide.

The entropy decoder 1015 can be configured to entropy decode the first stream of data. For example, an inverse Huffman or an inverse Arithmetic codec can be used to decode each of the values in the first buffer. The resultant decoded values can be delta values or deviation values. Therefore, as discussed above, decoding the first buffer can further include converting the delta values or deviation values. The entropy decoder 1015 can be configured to perform the inverse function of the entropy encoder 935.

The buffer 1020 can be configured to store a plurality of reconstructed values (e.g., a plurality of integers) each value indicating a number of points in a portion, region or block of the geometric construct. The buffer 1025 can be configured to store a plurality of values (e.g., a plurality of integers) each value indicating a position (e.g., a coordinate) of a point in a portion, region or block of the geometric construct. In an example implementation, each point that is in a block that includes less than or equal to the threshold number of points the lower left corner of the block is determined based on the subdivisions that led to block. Then, use the lower left corner as reference point and add the integers stored in the second buffer. Noting that the length of these values is not b or log(N). Instead the length is b-L, where L is the number of levels traversed in the k-D tree with respect to the corresponding axis. In other words, if blocks have been split up along the x-axis L times, then the x-coordinate of the lower left corner of the block is the first L bits of the x-coordinate of the point and the remaining b-L bits are read from the second buffer.

The buffer 1040 can be configured to store a value corresponding to or indicating an axis to divide. In an example implementation, the value can indicate the algorithm used by the k-D tree module 920 caused an axis division (e.g., generation of partitions described above) to deviate from a defined axis order. For example, in a 3D implementation, the k-D tree algorithm (e.g., as used by encoder 905 and decoder 1005) may select an axis in an x-axis, y-axis, z-axis order. In other words, if the last iteration divided within the y-axis, the decoder 1005 selects the z-axis as the next axis to divide within. However, using the technique described with regard to FIGS. 4A-4F a different axis could have been divided. Therefore, the decoder 1005 (e.g., the geometric construct module 1030) can read a value stored in the buffer 1040 and select a different axis based on the value read from the buffer 1040.

As discussed above, buffer 955 could be entropy encoded. Therefore, although not shown, buffer 1040 can be entropy decoded. Accordingly, the output of buffer 1040 could be input into entropy decoder 1015. In an implementation using the techniques described with regard to FIGS. 2A-2K and/or FIGS. 3A-3M, but not the techniques described with regard to FIGS. 4A-4F, the buffer 1040 may not be needed and could be optional or used as a design or execution option. For example, inclusion of the buffer 1040 could trigger the decoder 1005 (e.g., via the geometric construct module 1030) to use the technique described with regard to FIGS. 4A-4F.

The geometric construct module 1030 can be configured to reconstruct the geometric construct and the associated point cloud. Referring to FIGS. 5A-5C, the geometric construct module 1030 can determine which nodes are leaf nodes (e.g., node 224, node 226, node 334, node 336 and the like) based on the contents of buffer 1025. The geometric construct module 1030 can then insert points in the corresponding portion, region or block of the geometric construct based on the plurality of values stored in buffer 1025. The plurality of values can be delta values or deviation values and/or can have been communicated without leading zeroes. Therefore, as discussed above, the geometric construct module 1030 can further convert the delta values or deviation values as well as add leading zeroes.

The geometric construct module 1030 can use the contents of buffer 1020, buffer 1025 and/or buffer 1040 as well as a k-D tree algorithm based on the techniques described with regard to FIGS. 2A-2K, FIGS. 3A-3M and/or FIGS. 4A-4F (e.g., based on the same technique used by the k-D tree module 920 in encoder 905) generate the portion(s) or block(s) of the geometric construct in which to insert points. Data in or inclusion of the buffer 1040 may trigger the geometric construct module 1030 to use the technique described above with regard to FIGS. 4A-4F in reconstructing the geometric construct.

The de-quantization module 1035 can be configured to map or convert a single quantum value (integer value) to a range of values (e.g., float or double). In an example embodiment, de-quantization can convert a b-bit long integer representation to reconstructed floating points as the reconstructed point cloud. In an example implementation, the input (e.g., geometric data 910) is a b-bit long integer. Therefore, quantization may be redundant and as a result not necessary. Accordingly, processing performed by the quantization module can be skipped or optional.

Figure 11:
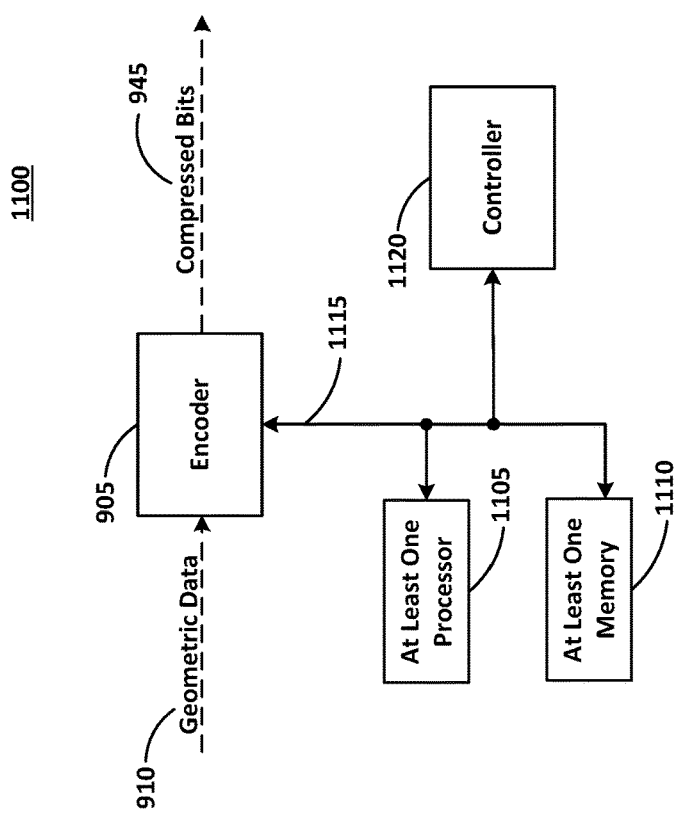
FIG. 11 illustrates an encoder system according to at least one example embodiment.

FIG. 11 illustrates an encoder system according to at least one example embodiment. In the example of FIG. 11, an encoder system 1100 may be at least one computing device and should be understood to represent virtually any computing device configured to perform the methods described herein. As such, the encoder system 1100 may be understood to include various standard components which may be utilized to implement the techniques described herein, or different or future versions thereof. By way of example, the encoder system 1100 is illustrated as including at least one processor 1105, as well as at least one memory 1110 (e.g., a computer readable storage medium).

Thus, as may be appreciated, the at least one processor 1105 may be utilized to execute instructions stored on the at least one memory 1110, so as to thereby implement the various features and functions described herein, or additional or alternative features and functions. Of course, the at least one processor 1105 and the at least one memory 1110 may be utilized for various other purposes. In particular, the at least one memory 1110 may be understood to represent an example of various types of memory and related hardware and software which might be used to implement any one of the modules described herein.

FIG. 11 illustrates the encoder system 1100 according to at least one example embodiment. As shown in FIG. 11, the encoder system 1100 includes the at least one processor 1105, the at least one memory 1110, a controller 1120, and the encoder 905. The at least one processor 1105, the at least one memory 1110, the controller 1120, and the encoder 905 are communicatively coupled via bus 1115.

The at least one processor 1105 may be configured to execute computer instructions associated with the controller 1120 and/or the encoder 905. The at least one processor 1105 may be a shared resource. For example, the encoder system 1100 may be an element of a larger system (e.g., a 2D or 3D scanner). Therefore, the at least one processor 1105 may be configured to execute computer instructions associated with other elements (e.g., controller laser scanner position or movement) within the larger system.

The at least one memory 1110 may be configured to store data and/or information associated with the encoder system 1100. For example, the at least one memory 1110 may be configured to store buffers including, for example, buffers storing geometric data, portions of the geometric data, positions of data points in the geometric data, a number of data points associated with a portion of the geometric data, and/or the like. For example, the at least one memory 1110 may be configured to store buffers including, for example, data associated with a geometric construct that has been generated using a k-D tree.

The controller 1120 may be configured to generate various control signals and communicate the control signals to various blocks in encoder system 1100. The controller 1120 may be configured to generate the control signals in accordance with the methods described above. The controller 1120 may be configured to control the encoder 905 to encode data associated with a geometric construct using a k-D tree according to example embodiments as described above. For example, the controller 1120 may generate and communicate a control signal indicating a number of bits used for a quantization scheme in the quantization module 915. For example, the controller 1120 may generate and communicate a control signal indicating an entropy encoding scheme (e.g., Huffman coding, arithmetic coding, folding integer coding or the like) used by the entropy encoder 935. For example, the controller 1120 may generate and communicate a control signal to allocate memory to buffers 925, 930, 955.

Figure 12:
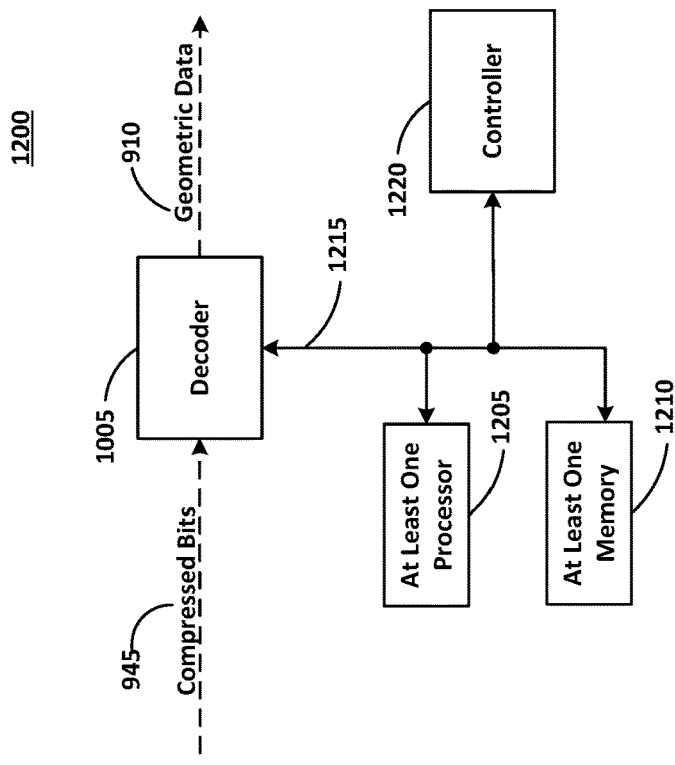
FIG. 12 illustrates a decoder system according to at least one example embodiment.

FIG. 12 illustrates a decoder system according to at least one example embodiment. In the example of FIG. 12, a decoder system 1200 may be at least one computing device and should be understood to represent virtually any computing device configured to perform the methods described herein. As such, the decoder system 1200 may be understood to include various standard components which may be utilized to implement the techniques described herein, or different or future versions thereof. By way of example, the decoder system 1200 is illustrated as including at least one processor 1205, as well as at least one memory 1210 (e.g., a computer readable storage medium).

Thus, the at least one processor 1205 may be utilized to execute instructions stored on the at least one memory 1210, so as to thereby implement the various features and functions described herein, or additional or alternative features and functions. Of course, the at least one processor 1205 and the at least one memory 1210 may be utilized for various other purposes. In particular, the at least one memory 1210 may be understood to represent an example of various types of memory and related hardware and software which might be used to implement any one of the modules described herein. According to example embodiments, the encoder system 1100 and the video decoder system 1200 may be included in a same larger system. Further, the at least one processor 1205 and the at least one processor 1105 may be a same at least one processor and the at least one memory 1210 and the at least one memory 1110 may be a same at least one memory. Still further, the controller 1220 and the controller 1120 may be a same controller.

The at least one processor 1205 may be configured to execute computer instructions associated with the controller 1220 and/or the decoder 1005. The at least one processor 1205 may be a shared resource. For example, the decoder system 1000 may be an element of a larger system (e.g., a mobile device). Therefore, the at least one processor 1205 may be configured to execute computer instructions associated with other elements (e.g., web browsing or wireless communication) within the larger system.

The at least one memory 1210 may be configured to store data and/or information associated with the decoder system 1200. For example, the at least one memory 1210 may be configured to store buffers including, for example, buffers storing geometric data, portions of the geometric data, positions of data points in the geometric data, a number of data points associated with a portion of the geometric data, and/or the like. For example, the at least one memory 1210 may be configured to store buffers including, for example, data associated with a geometric construct that has been generated using a k-D tree.

The controller 1220 may be configured to generate various control signals and communicate the control signals to various blocks in decoder system 1200. The controller 1220 may be configured to generate the control signals in accordance with the methods described above. The controller 1220 may be configured to control the decoder 1005 to decode data associated with a geometric construct using a k-D tree according to example embodiments as described above. For example, the controller 1220 may generate and communicate a control signal indicating a number of bits used for a quantization scheme in the de-quantization module 1035. For example, the controller 1220 may generate and communicate a control signal indicating an entropy encoding scheme (e.g., Huffman coding, arithmetic coding, or the like) used by the entropy decoder 1015. For example, the controller 1220 may generate and communicate a control signal to allocate memory to buffers 1020, 1025, 1040.

Figure 13:
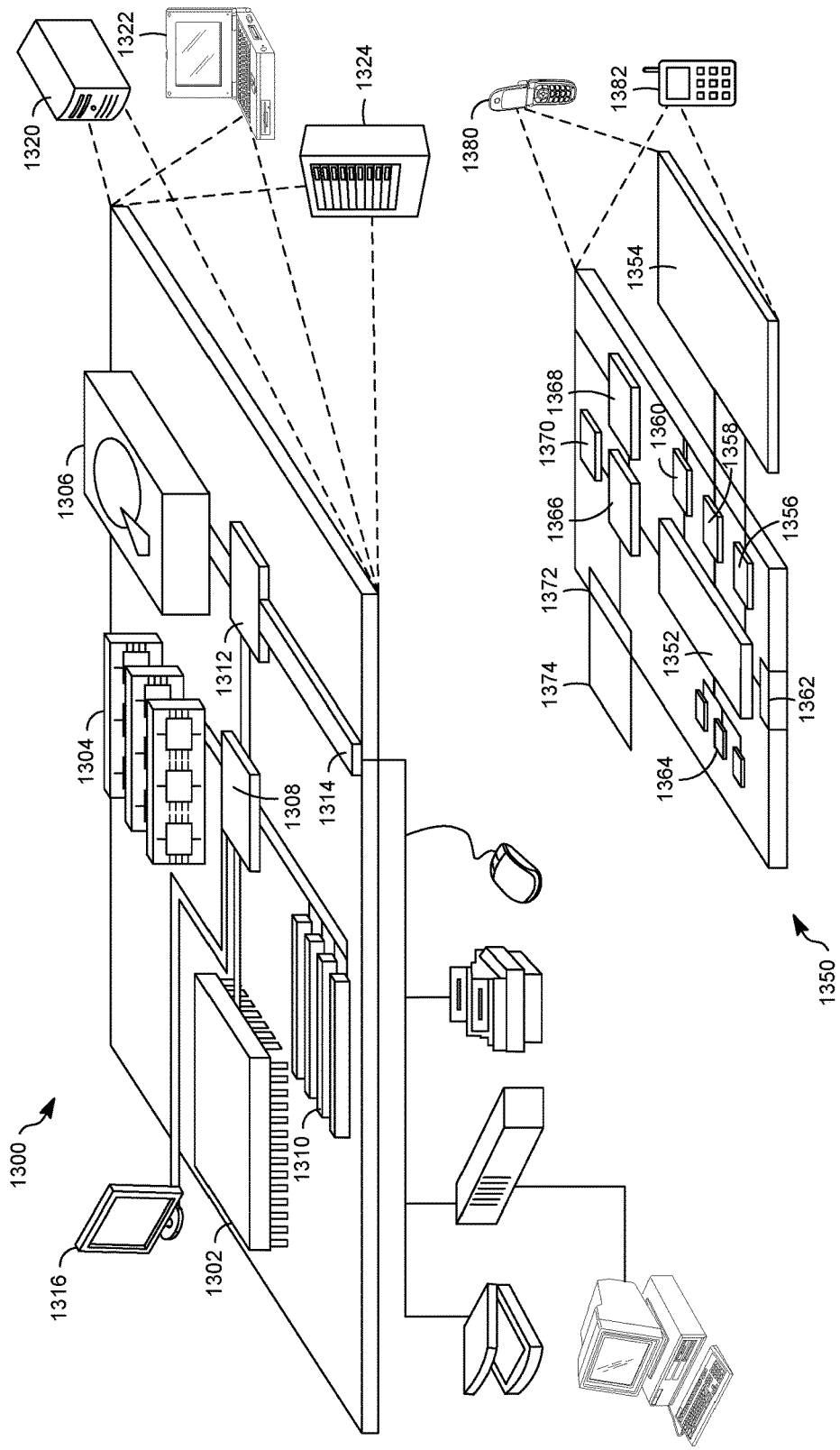
FIG. 13 shows an example of a computer device and a mobile computer device according to at least one example embodiment.

FIG. 13 shows an example of a computer device 1300 and a mobile computer device 1350, which may be used with the techniques described here. Computing device 1300 is intended to represent various forms of digital computers, such as laptops, desktops, workstations, personal digital assistants, servers, blade servers, mainframes, and other appropriate computers. Computing device 1350 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 1300 includes a processor 1302, memory 1304, a storage device 1306, a high-speed interface 1308 connecting to memory 1304 and high-speed expansion ports 1310, and a low speed interface 1312 connecting to low speed bus 1314 and storage device 1306. Each of the components 1302, 1304, 1306, 1308, 1310, and 1312, are interconnected using various busses, and may be mounted on a common motherboard or in other manners as appropriate. The processor 1302 can process instructions for execution within the computing device 1300, including instructions stored in the memory 1304 or on the storage device 1306 to display graphical information for a GUI on an external input/output device, such as display 1316 coupled to high speed interface 1308. In other implementations, multiple processors and/or multiple buses may be used, as appropriate, along with multiple memories and types of memory. Also, multiple computing devices 1300 may be connected, with each device providing portions of the necessary operations (e.g., as a server bank, a group of blade servers, or a multi-processor system).

The memory 1304 stores information within the computing device 1300. In one implementation, the memory 1304 is a volatile memory unit or units. In another implementation, the memory 1304 is a non-volatile memory unit or units. The memory 1304 may also be another form of computer-readable medium, such as a magnetic or optical disk.

The storage device 1306 is capable of providing mass storage for the computing device 1300. In one implementation, the storage device 1306 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 1304, the storage device 1306, or memory on processor 1302.

The high speed controller 1308 manages bandwidth-intensive operations for the computing device 1300, while the low speed controller 1312 manages lower bandwidth-intensive operations. Such allocation of functions is exemplary only. In one implementation, the high-speed controller 1308 is coupled to memory 1304, display 1316 (e.g., through a graphics processor or accelerator), and to high-speed expansion ports 1310, which may accept various expansion cards (not shown). In the implementation, low-speed controller 1312 is coupled to storage device 1306 and low-speed expansion port 1314. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 1300 may be implemented in a number of different forms, as shown in the figure. For example, it may be implemented as a standard server 1320, or multiple times in a group of such servers. It may also be implemented as part of a rack server system 1324. In addition, it may be implemented in a personal computer such as a laptop computer 1322. Alternatively, components from computing device 1300 may be combined with other components in a mobile device (not shown), such as device 1350. Each of such devices may contain one or more of computing device 1300, 1350, and an entire system may be made up of multiple computing devices 1300, 1350 communicating with each other.

Computing device 1350 includes a processor 1352, memory 1364, an input/output device such as a display 1354, a communication interface 1366, and a transceiver 1368, among other components. The device 1350 may also be provided with a storage device, such as a microdrive or other device, to provide additional storage. Each of the components 1350, 1352, 1364, 1354, 1366, and 1368, are interconnected using various buses, and several of the components may be mounted on a common motherboard or in other manners as appropriate.

The processor 1352 can execute instructions within the computing device 1350, including instructions stored in the memory 1364. The processor may be implemented as a chipset of chips that include separate and multiple analog and digital processors. The processor may provide, for example, for coordination of the other components of the device 1350, such as control of user interfaces, applications run by device 1350, and wireless communication by device 1350.

Processor 1352 may communicate with a user through control interface 1358 and display interface 1356 coupled to a display 1354. The display 1354 may be, for example, a TFT LCD (Thin-Film-Transistor Liquid Crystal Display) or an OLED (Organic Light Emitting Diode) display, or other appropriate display technology. The display interface 1356 may comprise appropriate circuitry for driving the display 1354 to present graphical and other information to a user. The control interface 1358 may receive commands from a user and convert them for submission to the processor 1352. In addition, an external interface 1362 may be provided in communication with processor 1352, to enable near area communication of device 1350 with other devices. External interface 1362 may provide, for example, for wired communication in some implementations, or for wireless communication in other implementations, and multiple interfaces may also be used.

The memory 1364 stores information within the computing device 1350. The memory 1364 can be implemented as one or more of a computer-readable medium or media, a volatile memory unit or units, or a non-volatile memory unit or units. Expansion memory 1374 may also be provided and connected to device 1350 through expansion interface 1372, which may include, for example, a SIMM (Single In Line Memory Module) card interface. Such expansion memory 1374 may provide extra storage space for device 1350, or may also store applications or other information for device 1350. Specifically, expansion memory 1374 may include instructions to carry out or supplement the processes described above, and may include secure information also. Thus, for example, expansion memory 1374 may be provide as a security module for device 1350, and may be programmed with instructions that permit secure use of device 1350. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 1364, expansion memory 1374, or memory on processor 1352, that may be received, for example, over transceiver 1368 or external interface 1362.

Device 1350 may communicate wirelessly through communication interface 1366, which may include digital signal processing circuitry where necessary. Communication interface 1366 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 1368. In addition, short-range communication may occur, such as using a Bluetooth, Wi-Fi, or other such transceiver (not shown). In addition, GPS (Global Positioning System) receiver module 1370 may provide additional navigation- and location-related wireless data to device 1350, which may be used as appropriate by applications running on device 1350.

Device 1350 may also communicate audibly using audio codec 1360, which may receive spoken information from a user and convert it to usable digital information. Audio codec 1360 may likewise generate audible sound for a user, such as through a speaker, e.g., in a handset of device 1350. Such sound may include sound from voice telephone calls, may include recorded sound (e.g., voice messages, music files, etc.) and may also include sound generated by applications operating on device 1350.

The computing device 1350 may be implemented in a number of different forms, as shown in the figure. For example, it may be implemented as a cellular telephone 1380. It may also be implemented as part of a smart phone 1382, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. Various implementations of the systems and techniques described here can be realized as and/or generally be referred to herein as a circuit, a module, a block, or a system that can combine software and hardware aspects. For example, a module may include the functions/acts/computer program instructions executing on a processor (e.g., a processor formed on a silicon substrate, a GaAs substrate, and the like) or some other programmable data processing apparatus.

Some of the above example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed above, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term and/or includes any and all combinations of one or more of the associated listed items.

It will be understood that when an element is referred to as being connected or coupled to another element, it can be directly connected or coupled to the other element or intervening elements may be present. In contrast, when an element is referred to as being directly connected or directly coupled to another element, there are no intervening elements present. Other words used to describe the relationship between elements should be interpreted in a like fashion (e.g., between versus directly between, adjacent versus directly adjacent, etc.).

The terminology used herein is for the purpose of describing particular embodiments only and is not intended to be limiting of example embodiments. As used herein, the singular forms a, an and the are intended to include the plural forms as well, unless the context clearly indicates otherwise. It will be further understood that the terms comprises, comprising, includes and/or including, when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the above example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as processing or computing or calculating or determining of displaying or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the example embodiments are typically encoded on some form of non-transitory program storage medium or implemented over some type of transmission medium. The program storage medium may be magnetic (e.g., a floppy disk or a hard drive) or optical (e.g., a compact disk read only memory, or CD ROM), and may be read only or random access. Similarly, the transmission medium may be twisted wire pairs, coaxial cable, optical fiber, or some other suitable transmission medium known to the art. The example embodiments not limited by these aspects of any given implementation.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. An encoder comprising:
a processor;
a buffer; and
a memory, the memory including code as instructions that cause the processor to:
quantize geometric data associated with a geometric construct,
partition the geometric construct into a plurality of blocks,
determine a number of points in a block of the plurality of blocks,
generate a deviation value based on the number of points in the block,
store the deviation value in the buffer,
entropy encode the deviation value, and
wherein the deviation value based on the number of points is determined based at least on a number of points in the geometric construct.

2. The encoder of claim 1, wherein the quantizing of the geometric data includes converting a float or double precision value associated with the geometric data into a b-bit integer representation.

3. The encoder of claim 1, wherein the geometric data represents a point cloud and the geometric construct is a two or more dimensional shape encompassing the point cloud.

4. The encoder of claim 1, wherein the partitioning of the geometric construct includes recursively partitioning the geometric construct using a k-D tree.

5. The encoder of claim 1, wherein
the partitioning of the geometric construct includes partitioning the geometric construct using a k-D tree,
determining whether the block includes more than a threshold number of points,
upon determining the block includes more than the threshold number of points:
store the number of points in the buffer, and
further partition the block including more than the threshold number of points, and
upon determining the block includes less than the threshold number of points:
determine whether the block includes at least one point,
upon determining the block includes at least one point:
the buffer is a first buffer,
the encoder further includes a second buffer, and
store a value representing a position of a point in the second buffer.

6. The encoder of claim 1, wherein the partitioning of the geometric construct includes partitioning the geometric construct using a k-D tree into a first block and a second block,
the first block includes a third block and a fourth block, and
the deviation value corresponding to the number of points in the third block is determined based on a number of points in the first block.

7. A method comprising:
quantizing geometric data associated with a geometric construct,
partitioning the geometric construct into a plurality of blocks,
determining a number of points in a block of the plurality of blocks,
generate a deviation value based on the number of points in the block,
storing the deviation value in a buffer,
entropy encoding the deviation value, and
wherein the deviation value based on the number of points is determined based at least on a number of points in the geometric construct.

8. The method of claim 7, wherein the quantizing of the geometric data includes converting a float or double precision value associated with the geometric data into a b-bit integer representation.

9. The method of claim 7, wherein the geometric data represents a point cloud and the geometric construct is a two or more dimensional shape encompassing the point cloud.

10. The method of claim 7, wherein the partitioning of the geometric construct includes recursively partitioning the geometric construct using a k-D tree.

11. The method of claim 7, wherein
the partitioning of the geometric construct includes partitioning the geometric construct using a k-D tree,
determining whether the block includes more than a threshold number of points,
upon determining the block includes more than the threshold number of points:
store the number of points in the buffer, and
further partition the block including more than the threshold number of points, and
upon determining the block includes less than the threshold number of points:
determine whether the block includes at least one point,
upon determining the block includes at least one point:
the buffer is a first buffer,
the encoder further includes a second buffer, and
store a value representing a position of a point in the second buffer.

12. The method of claim 7, wherein
the partitioning of the geometric construct includes partitioning the geometric construct using a k-D tree into a first block and a second block,
the first block includes a third block and a fourth block, and
the deviation value corresponding to the number of points in the third block is determined based on a number of points in the first block.

13. A decoder comprising:
a processor;
a first buffer;
a second buffer; and
a memory, the memory including code as instructions that cause the processor to:
load the first buffer using data from an encoded geometric data file, load the second buffer using data from the encoded geometric data file, entropy decode the first buffer, determine a first partition in a geometric construct to insert data from the first buffer, insert a first number of points based on the data from the first buffer into the partition, determine whether the first number of points is greater than a threshold value, upon determining the first number of points is greater than the threshold value, divide the first partition into a second partition and third partition, and move a subset of the first number of points to one of the second partition or the third partition based on the data from the first buffer, upon determining the first number of points is less than or equal to the threshold value, position a point in the first partition based on data in the second buffer, and repeat the determining whether the first number of points is greater than the threshold value on the second partition or the third partition replacing the first number of points with the subset of the first number of points and until each partition in the geometric construct includes a number of points less than or equal to the threshold value.

14. The decoder of claim 13, wherein the entropy decoding of the first buffer includes converting a deviation value corresponding to a number of points in the second partition.

15. The decoder of claim 13, wherein the geometric data file includes geometric data representing a point cloud and the geometric construct is a two or more dimensional shape encompassing the point cloud.

16. The decoder of claim 13, wherein determining the first partition and determining the second partition includes building a k-D tree based on the first buffer and the second buffer.

17. The decoder of claim 13, wherein the entropy decoding of the first buffer includes converting a deviation value corresponding to a number of points in the second partition, and the deviation value corresponding to the number of points is determined based on a number of points in a larger partition including the partition.

18. The decoder of claim 13, wherein the second buffer includes data representing a position of a point in the geometric construct.

\* \* \* \* \*